US012809242B2

(12) United States Patent
Yoneyama et al.

(10) Patent No.: US 12,809,242 B2
(45) Date of Patent: Nov. 24, 2026

(54) PROJECTOR HAVING BLADE PART THAT GENERATE AIRFLOW

(71) Applicant: SEIKO EPSON CORPORATION, Tokyo (JP)

(72) Inventors: Takuo Yoneyama, Azumino (JP); Keita Tsukioka, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 253 days.

(21) Appl. No.: 18/754,767

(22) Filed: Jun. 26, 2024

(65) Prior Publication Data

US 2025/0004355 A1 Jan. 2, 2025

(30) Foreign Application Priority Data

Jun. 27, 2023 (JP) ................................ 2023-104807

(51) Int. Cl.

| | |
|---|---|
| ***G03B 21/16*** | (2006.01) |
| ***G03B 21/20*** | (2006.01) |
| ***H05K 7/20*** | (2006.01) |

(52) U.S. Cl.

CPC ......... *G03B 21/16* (2013.01); *G03B 21/2013* (2013.01); *H05K 7/20154* (2013.01); *H05K 7/20172* (2013.01)

(58) Field of Classification Search

CPC .... H04N 9/315; H04N 9/3114; H04N 9/3129; H04N 9/3161; H04N 9/3164; G02B 26/12; G02B 26/101; G02B 26/121; G03B 21/14; G03B 21/28; G03B 21/43; G03B 21/142; G03B 21/145; G03B 21/208; G03B 21/2013; G03B 21/2033; G03B 21/2053; G03B 21/2066; H05K 7/00; H05K 7/20154; H05K 7/20172

See application file for complete search history.

(56) References Cited

U.S. PATENT DOCUMENTS

| | | | | |
|---|---|---|---|---|
| 2005/0179872 A1 | 8/2005 | Akiyama | | |
| 2005/0259308 A1* | 11/2005 | Itoh ...................... | H04N 9/3117 | 359/211.2 |

(Continued)

FOREIGN PATENT DOCUMENTS

| | | | |
|---|---|---|---|
| JP | H08-022006 A | 1/1996 | |
| JP | 2005-208500 A | 8/2005 | |
| JP | 2007-225956 A | 9/2007 | |

*Primary Examiner* — Sultan Chowdhury
(74) *Attorney, Agent, or Firm* — Oliff PLC

(57) ABSTRACT

A projector according to the present disclosure includes a light source, a first heat generator, and an optical apparatus that temporally displaces the optical path of the light output from the light source, the optical apparatus including a first transmissive optical part, a first driver that rotates the first transmissive optical part, and a first blade part that is coupled to the first transmissive optical part and generates an airflow that cools the first heat generator, the first transmissive optical part rotating around a first axis of rotation along a second direction that intersects with a first direction in which the light output from the light source is incident on the first transmissive optical part to displace the optical path of the light, and the first driver rotating the first blade part along with the first transmissive optical part to generate the airflow.

9 Claims, 10 Drawing Sheets

(56) References Cited

U.S. PATENT DOCUMENTS

| | | | | |
|---|---|---|---|---|
| 2016/0004146 | A1* | 1/2016 | Nouda | G03B 21/16<br>353/61 |
| 2020/0099902 | A1* | 3/2020 | Egawa | H04N 9/3158 |
| 2021/0157219 | A1* | 5/2021 | Mikutsu | G03B 21/28 |
| 2022/0299853 | A1* | 9/2022 | Takagi | G03B 21/204 |
| 2022/0299856 | A1* | 9/2022 | Uchiyama | G02B 5/3083 |
| 2022/0413373 | A1* | 12/2022 | Kadotani | G03B 21/16 |
| 2023/0213846 | A1* | 7/2023 | Hsu | G03B 21/16<br>353/100 |
| 2023/0266648 | A1* | 8/2023 | Ito | G03B 21/142<br>353/101 |

* cited by examiner

PROJECTOR HAVING BLADE PART THAT GENERATE AIRFLOW

The present application is based on, and claims priority from JP Application Serial Number 2023-104807, filed Jun. 27, 2023, the disclosure of which is hereby incorporated by reference herein in its entirety.

BACKGROUND

1. Technical Field

The present disclosure relates to a projector.

2. Related Art

As a light source apparatus used for a projector, there has been a proposed light source apparatus that illuminates a light modulator, such as a liquid crystal panel, by temporally scanning the light modulator with the light emitted from a light emitter.

JP-A-2007-225956 discloses a projector including a light source apparatus including a light source lamp, a liquid crystal light valve, a polygonal mirror provided between the light source apparatus and the liquid crystal light valve, and a projection lens. In the projector, the polygonal mirror reflects the light output from the light source apparatus to scan an image formation region of the liquid crystal light valve.

JP-A-2007-225956 is an example of the related art.

In the projector disclosed in JP-A-2007-225956 described above, since the liquid crystal light valve, on which the light from the light source apparatus is incident, for example, forms a heat generator, it is conceivable to provide a cooling apparatus. Newly providing a cooling apparatus, however, requires a space in which the cooling apparatus is separately provided, so that there is a problem of an increase in size of the apparatus configuration of the projector.

SUMMARY

To solve the problem described above, a projector according to an aspect of the present disclosure includes a light source apparatus, a first heat generator that generates heat, and an optical apparatus that temporally displaces an optical path of light output from the light source apparatus, the optical apparatus including a first transmissive optical part that transmits and outputs the light incident from the light source apparatus, a first driver that is coupled to the first transmissive optical part and rotates the first transmissive optical part, and a first blade part that is coupled to the first transmissive optical part and generates an airflow that cools the first heat generator, the first transmissive optical part rotating around a first axis of rotation along a second direction that intersects with a first direction in which the light output from the light source apparatus is incident on the first transmissive optical part to displace an optical path of the light, the first driver rotating the first blade part along with the first transmissive optical part to generate the airflow.

DESCRIPTION OF EMBODIMENTS

First Embodiment

A first embodiment of the present disclosure will be described below with reference to the drawings.

A projector according to the present embodiment is an example of a liquid crystal projector using liquid crystal panels as light modulators.

In the following drawings, components are drawn at different dimensional scales in some cases for clarity of each of the components.

Figure 1:
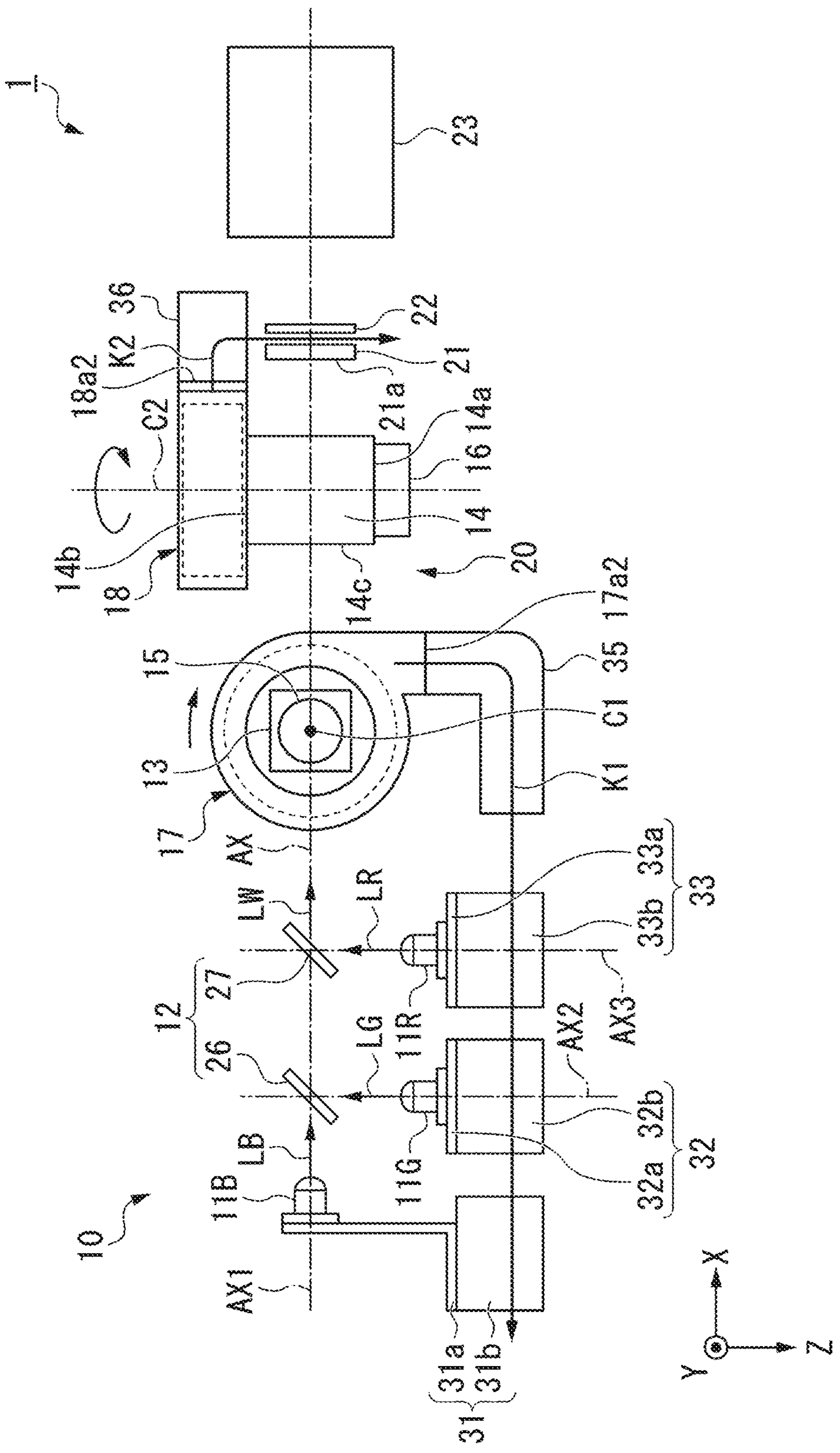
FIG. 1 is a plan view showing a schematic configuration of a projector according to a first embodiment.

FIG. 1 is a plan view showing a schematic configuration of a projector 1 according to the present embodiment.

The projector 1 according to the present embodiment includes a light source apparatus 10, an optical apparatus 20, a first duct member 35, a second duct member 36, a light modulator 21, a light-exiting-side polarizer 22, and a projection optical apparatus 23, as shown in FIG. 1.

The light source apparatus 10 includes a first light emitter 11B, a second light emitter 11G, a third light emitter 11R, a light combining system 12, a first heat absorbing member 31, a second heat absorbing member 32, and a third heat absorbing member 33. The optical apparatus 20 includes a first transmissive optical part 13, a second transmissive optical part 14, a first driver 15, a second driver 16, a first fan 17, and a second fan 18.

The following description with reference to the drawings will be made by using an XYZ orthogonal coordinate system in as required. The X-axis is an axis parallel to an illumination optical axis AX of the light source apparatus 10. The illumination optical axis AX of the light source apparatus 10 is defined as an axis extending along the chief ray of the light output from the light source apparatus 10. The Y-axis is an axis perpendicular to the X-axis and extending along a first axis of rotation C1 of the first transmissive optical part 13. The Z-axis is an axis perpendicular to the X-axis and the Y-axis and extending along a second axis of rotation C2 of the second transmissive optical part 14.

The X-axis direction in the present embodiment corresponds to the "first direction" in the claims. The Y-axis direction in the present embodiment corresponds to the "second direction" in the claims. The Z-axis direction in the present embodiment corresponds to the "third direction" in the claims.

In the following description, the directions along the first axis of rotation C1, the second axis of rotation C2, and other axes may each be simply referred to as an "axial direction", and the circumferential directions around the axes may each be simply referred to as a "circumferential direction".

The first light emitter 11B emits first light LB, which belongs to a first wavelength band. The first light emitter 11B is formed of a laser diode. The first light LB emitted from the first light emitter 11B is therefore linearly polarized coherent light, and is highly parallel laser light having a narrow luminous flux width. The first wavelength band is, for example, a blue wavelength band having a range of 450 nm±5 nm. That is, the first light LB is blue light. The first light LB is hereinafter referred to as blue light LB.

The second light emitter 11G emits second light LG, which belongs to a second wavelength band. The second light emitter 11G is formed of a laser diode. The second light LG emitted from the second light emitter 11G is therefore linearly polarized coherent light, and is highly parallel laser light having a narrow luminous flux width. The second wavelength band is, for example, a green wavelength band having a range of 530 nm±5 nm. That is, the second light LG is green light. The second light LG is hereinafter referred to as green light LG.

The third light emitter 11R emits third light LR, which belongs to a third wavelength band. The third light emitter 11R is formed of a laser diode. The third light LR emitted from the third light emitter 11R is therefore linearly polarized coherent light, and is highly parallel laser light having a narrow luminous flux width. The third wavelength band is, for example, a red wavelength band having a range of 650 nm±5 nm. That is, the third light LR is red light. The third light LR is hereinafter referred to as red light LR.

An optical axis AX1 of the first light emitter 11B is defined as an axis along the chief ray of the blue light LB emitted from the first light emitter 11B. An optical axis AX2 of the second light emitter 11G is defined as an axis along the chief ray of the green light LG emitted from the second light emitter 11G. An optical axis AX3 of the third light emitter 11R is defined as an axis along the chief ray of the red light LR emitted from the third light emitter 11R. Note that the optical axis AX1 of the first light emitter 11B coincides with the illumination optical axis AX of the light source apparatus 10.

The first light emitter 11B is so disposed that the optical axis AX1 of the first light emitter 11B is perpendicular to the optical axis AX2 of the second light emitter 11G. The third light emitter 11R is so disposed that the optical axis AX3 of the third light emitter 11R is parallel to the optical axis AX2 of the second light emitter 11G. In the present embodiment, the first light emitter 11B is disposed upstream from the second light emitter 11G, and the third light emitter 11R is disposed downstream from the second light emitter 11G, and the positions of the first light emitter 11B and the third light emitter 11R may be swapped. That is, the first light emitter 11B, the second light emitter 11G, and the third light emitter 11R are not necessarily arranged as described in the present embodiment, and may be combined in any manner.

The light combining system 12 includes a first light combiner 26 and a second light comber 27. The first light combiner 26 is provided at the position where the optical axes AX1 and AX2 intersect with each other. The first light combiner 26 is formed of a dichroic mirror that reflects the green light LG and transmits the blue light LB. The second light combiner 27 is provided at the position where the optical axes AX1 and AX3 intersect with each other. The second light combiner 27 is formed of a dichroic mirror that transmits the green light LG and the blue light LB and reflects the red light LR. The light combining system 12 combines the blue light LB emitted from the first light emitter 11B, the green light LG emitted from the second light emitter 11G, and the red light LR emitted from the third light emitter 11R with one another to generate white illumination light LW. That is, the illumination light LW contains the green light LG, the blue light LB, and the red light LR, and is output toward the first transmissive optical part 13.

The first heat absorbing member 31 is a member that absorbs heat generated in the first light emitter 11B. The first heat absorbing member 31 is thermally coupled to the first light emitter 11B. The phrase "thermally coupled" means that the first light emitter 11B and the first heat absorbing member 31 may not be in direct contact with each other, and the first light emitter 11B and the first heat absorbing member 31 may be in indirect contact with each other via another heat conduction member, as long as the first light emitter 11B and the first heat absorbing member 31 are coupled to each other in a state in which the heat of the first light emitter 11B is transferable toward the first heat absorbing member 31. The first heat absorbing member 31 includes a heat pipe 31*a* coupled to the first light emitter 11B, and a plurality of heat dissipating fins 31*b* provided at the heat pipe 31*a*.

The heat pipe 31*a* is fixed to the first light emitter 11B with screw members or an adhesive. The heat pipe 31*a* is formed of a pipe containing a refrigerant. The heat pipe 31*a* includes a heat receiver provided at one end and coupled to the first light emitter 11B, and a heat dissipater provided at the other end and provided with the plurality of heat dissipating fins 31*b*. The heat pipe 31*a*, in which the heat received by the heat receiver vaporizes the refrigerant into a gas and the heat dissipater condenses the gas into a liquid, can absorb the heat from the first light emitter 11B. The heat pipe 31*a* is formed of a pipe made of metal that excels in heat conductivity, such as silver, copper, gold, and aluminum.

The heat dissipating fins 31*b* are plates extending along the XZ plane, and are juxtaposed at intervals along the Y-axis direction. The heat dissipating fins 31*b* are made of metal that excels in heat conductivity, such as silver, copper, gold, and aluminum, as the heat pipe 31*a* is.

The second heat absorbing member 32 is a member that absorbs heat generated in the second light emitter 11G. The second heat absorbing member 32 is thermally coupled to the second light emitter 11G.

The second heat absorbing member 32 is a heat sink including a main body 32*a*, which supports the second light emitter 11G, and a plurality of heat dissipating fins 32*b* provided at the main body 32*a*. The heat dissipating fins 32*b* are plates extending along the XZ plane, and juxtaposed at intervals along the Y-axis direction at the surface of the main body 32*a* that is opposite from the surface that supports the second light emitter 11G. The main body 32*a* and the heat dissipating fins 32*b* are made of metal that excels in heat conductivity, such as silver, copper, gold, and aluminum.

The third heat absorbing member 33 is a member that absorbs heat generated in the third light emitter 11R. The third heat absorbing member 33 is thermally coupled to the third light emitter 11R. The third heat absorbing member 33 is a heat sink including a main body 33*a*, which supports the third light emitter 11R, and a plurality of heat dissipating fins 33*b* provided at the main body 33*a*. The heat dissipating fins 33*b* are plates extending along the XZ plane, and juxtaposed at intervals along the Y-axis direction at the surface of the main body 33*a* that is opposite from the surface that supports the third light emitter 11R. The main body 33*a* and the heat dissipating fins 33*b* are made of metal that excels in heat conductivity, such as silver, copper, gold, and aluminum.

The first heat absorbing member 31 in the present embodiment, which employs a structure using the heat pipe 31*a* different from those of the second heat absorbing member 32 and the third heat absorbing member 33, allows the heat dissipating fins 31*b* to be disposed so as to be aligned with the heat dissipating fins 32*b* of the second heat absorbing member 32 and the heat dissipating fins 33*b* of the third heat absorbing member 33.

In the projector 1 according to the present embodiment, in which a laser diode is employed as each of the light emitters 11B, 11G, and 11R of the light source apparatus 10, a large amount of heat is generated in each of the heat absorbing members 31, 32, and 33. Therefore, in the projector 1 according to the present embodiment, the heat absorbing members 31, 32, and 33 of the light source apparatus 10 form a first heat generator. That is, in the projector 1 according to the present embodiment, it can in other words be said that the optical apparatus 20 includes the first heat generator.

The projector 1 according to the present embodiment is configured to cool each of the heat absorbing members 31, 32, and 33 as the first heat generator with an airflow K1, as will be described later.

The optical apparatus 20 temporally displaces the optical path of the illumination light LW output from the light source apparatus 10. The light modulator 21 can thus be two-dimensionally scanned with the illumination light LW output from the light source apparatus 10. A specific configuration of the optical apparatus 20 will be described later.

The light modulator 21 is provided on the light exiting side of the light source apparatus 10 in the illumination optical axis AX. The light modulator 21 modulates the illumination light LW output from the light source apparatus 10 in accordance with image information to form image light. A transmissive liquid crystal panel is used as the light modulator 21. The liquid crystal panel may or may not include a color filter. When the liquid crystal panel includes a color filter, the projector 1 capable of color display can be realized. When the liquid crystal panel does not include a color filter, the projector 1 capable of monochrome display can be realized. Examples of a method for driving the liquid crystal panels include, but not particularly limited to, a twisted nematic (TN) method, a vertical alignment (VA) method, and an in-plane switching (IPS) method.

The light modulator 21 has a light modulation region 21*a*. The light modulation region 21*a* is a region where a plurality of pixels are arranged in a matrix, modulates the illumination light LW incident on the light modulator 21, and outputs the modulated illumination light LW. An illumination receiving region two-dimensionally scanned with the illumination light LW by the optical apparatus 20, as will be described later, corresponds to the light modulation region 21*a*. The size, the refractive index, and other parameters of each of the transmissive optical parts 13 and 14 of the optical apparatus 20 are designed in accordance with the size and the aspect ratio of the light modulation region 21*a*.

The light-exiting-side polarizer 22 is provided between the light modulator 21 and the projection optical apparatus 23 in the illumination optical axis AX. The light-exiting-side polarizer 22 transmits linearly polarized light output from the light modulator 21 and polarized in a specific direction toward the projection optical apparatus 23. In the present embodiment, since a laser diode is used as each of the light emitters 11B, 11G, and 11R of the light source apparatus 10, linearly polarized light is output from the light source apparatus 10. It is therefore unnecessary to provide a light-incident-side polarizer on the light incident side of the light modulator 21.

The projection optical apparatus 23 is formed of a plurality of projection lenses. The projection optical apparatus 23 enlarges the image light modulated by the light modulator 21 and projects the enlarged image light toward a projection receiving surface, such as a screen. The projector 1 according to the present embodiment can thus display an image on the projection receiving surface.

In the projector 1 according to the present embodiment, a large amount of heat is generated by the light modulator 21, which is the target illuminated with the illumination light LW. Similarly, a large amount of heat is generated also by the light-exiting-side polarizer 22, which absorbs part of the light output from the light modulator 21.

It can therefore in other words be said that the projector 1 according to the present embodiment includes the light modulator 21 and the light-exiting-side polarizer 22 as a second heat generator.

The projector 1 according to the present embodiment is configured to cool the light modulator 21 and the light-exiting-side polarizer 22 as the second heat generator with an airflow K2, as will be described later.

The configuration of the optical apparatus 20 will be subsequently described.

The first transmissive optical part 13 is formed of a translucent member that is rotatably supported. The first transmissive optical part 13 is coupled to the first driver 15, which is formed, for example, of a motor, and is rotatable around the first axis of rotation C1 extending along the Y-axis direction. The first axis of rotation C1 is an imaginary axis and passes through the center of the rotary shaft of the first driver 15.

The first transmissive optical part 13 is rotated around the first axis of rotation C1 by the first driver 15 to displace the optical path of the illumination light LW.

The second transmissive optical part 14 is provided at the light exiting side of the first transmissive optical part 13 in the illumination optical axis AX of the light source apparatus 10. The second transmissive optical part 14 is formed of a translucent member that is rotatably supported. The second transmissive optical part 14 is rotatable around the second axis of rotation C2 extending along the Z-axis direction. That is, the first axis of rotation C1 and the second axis of rotation C2 extend in directions perpendicular to each other in an imaginary plane perpendicular to the illumination optical axis AX. The second axis of rotation C2 is coupled to the second driver 16 formed, for example, of a motor. The second transmissive optical part 14 is rotated around the second axis of rotation C2 by the second driver 16.

Figure 2:
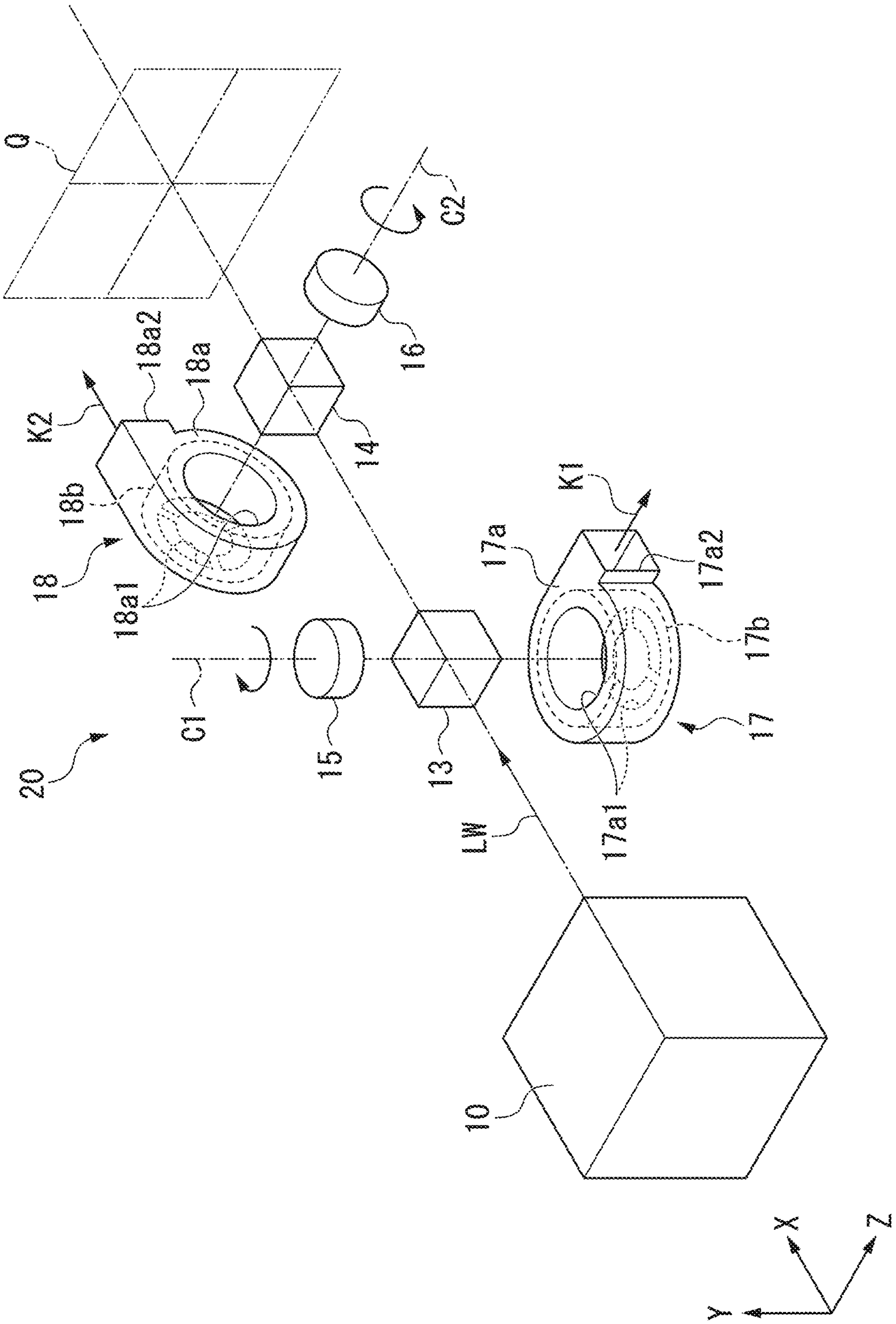
FIG. 2 is a perspective view showing a schematic configuration of a light source apparatus.

FIG. 2 is a perspective view showing a schematic configuration of the light source apparatus 10 in the present embodiment.

As the glass material of the translucent member that constitutes the first transmissive optical part 13, optical glass such as BK7 or a translucent material such as quartz or resin is, for example, used, as shown in FIG. 2. The first transmissive optical part 13 has a first surface 13*a* and a second surface 13*b*, which intersect with the first axis of rotation C1, and four first side surfaces 13*c*1, 13*c*2, 13*c*3, and 13*c*4, which are in contact with the first surface 13*a* and the second surface 13*b* at right angles. That is, the first transmissive optical part 13 has a quadrangular prismatic shape having six planar surfaces including the first surface 13*a*, the second surface 13*b*, and the four first side surfaces 13*c*1, 13*c*2, 13*c*3, and 13*c*4. The cross-section of the first transmissive optical part 13 taken along a plane perpendicular to the first axis of rotation C1 has a square shape. That is, the four first side surfaces 13*c*1, 13*c*2, 13*c*3, and 13*c*4 have the same area, and any pair of the first side surfaces facing each other are parallel to each other.

The first transmissive optical part 13 transmits and outputs the illumination light LW incident from the light source apparatus 10 while rotating around the first axis of rotation C1. The first side surface of the first transmissive optical part 13 on which the illumination light LW output from the light source apparatus 10 is incident is therefore not fixed at one specific surface, and changes with time. Similarly, the first side surface of the first transmissive optical part 13 via which the illumination light LW incident on the first transmissive optical part 13 exits to the external space is not fixed at one specific surface, and changes with time. The first side surface of the first transmissive optical part 13 on which the illumination light LW output from the light source apparatus 10 is incident is referred to as a first light incident surface. A first side surface via which the illumination light LW incident from the first light incident surface exits is referred to as a first light exiting surface. In this case, the first light incident surface and the first light exiting surface change with time, and are a pair of two first side surfaces parallel to each other out of the four first side surfaces 13*c*1, 13*c*2, 13*c*3, and 13*c*4.

In the present specification, when two surfaces of a transmissive optical part are referred to as surfaces parallel to each other, a case where an angle between the two surfaces falls within a range of 0±5 degrees is referred to as "parallel" in consideration of processing accuracy of a glass material of which the translucent member is made, an allowable range of the parallelism of the light, and other parameters.

In the present embodiment, the first transmissive optical part 13 has the four first side surfaces 13*c*1, 13*c*2, 13*c*3, and 13*c*4, but the number of first side surfaces may not necessarily be four, but is desirably 2×m (m is natural number greater than or equal to 2). That is, the number of first side surfaces is desirably an even number, for example, six or eight. When the number of first side surfaces is an even number, one selected from the first side surfaces is parallel to the first side surface facing the selected first side surface, and there are no first side surfaces that face each other but are not parallel to each other. The first transmissive optical part 13 therefore does not generate much stray light, and can use the light at increased efficiency.

The translucent member that constitutes the second transmissive optical part 14 is substantially the same as the translucent member that constitutes the first transmissive optical part 13. As the glass material of the translucent member, optical glass such as BK7 or a translucent material such as quartz or resin is, for example, used. In particular, in the case of the second transmissive optical part 14, unlike the first transmissive optical part 13, the illumination light LW, with which the illumination receiving region has been scanned in one direction by the first transmissive optical part 13, is incident on the second transmissive optical part 14, so that the illumination light LW incident on the second transmissive optical part 14 has an optical density lower than that of the illumination light LW incident on the first transmissive optical part 13. The second transmissive optical part 14 can therefore be more likely to be made of a resin material having low light resistance or heat resistance than the first transmissive optical part 13.

The second transmissive optical part 14 has a third surface 14*a* and a fourth surface 14*b*, which intersect with the second axis of rotation C2, and four second side surfaces 14*c*, which are in contact with the third surface 14*a* and the fourth surface 14*b* at right angles, as shown in FIG. 1. That is, the second transmissive optical part 14 has a quadrangular prismatic shape having six planar surfaces including the third surface 14*a*, the fourth surface 14*b*, and the four second side surfaces 14*c*. The cross-section of the second transmissive optical part 14 taken along a plane perpendicular to the second axis of rotation C2 has a square shape. That is, the four second side surfaces 14*c* have the same area, and any pair of the second side surfaces facing each other are parallel to each other.

The second transmissive optical part 14 transmits the illumination light LW output from the first transmissive optical part 13 while rotating around the second axis of rotation C2. The second side surface of the second transmissive optical part 14 on which the illumination light LW output from the first transmissive optical part 13 is incident is therefore not fixed at one specific surface, and changes with time. Similarly, the second side surface of the second transmissive optical part 14 via which the illumination light LW incident on the second transmissive optical part 14 exits to the external space is not fixed at one specific surface, and changes with time. A second side surface of the second transmissive optical part 14 on which the illumination light LW output from the first transmissive optical part 13 is incident is referred to as a second light incident surface. A second side surface via which the illumination light LW incident from the second light incident surface exits is referred to as a second light exiting surface. In this case, the second light incident surface and the second light exiting surface change with time, and are a pair of two second side surfaces parallel to each other out of the four second side surfaces 14*c*.

In the present embodiment, the second transmissive optical part 14 has the four second side surfaces 14*c*, but the number of second side surfaces is not necessarily four, but is desirably 2×n (n is natural number greater than or equal to 2). That is, the number of second side surfaces is desirably an even number, for example, six or eight. When the number of second side surfaces is an even number, one selected from the second side surfaces is parallel to the second side surface facing the selected second side surface, and there are no second side surfaces that face each other but are not parallel to each other. The second transmissive optical part 14 therefore does not generate much stray light, and can use the light at increased efficiency.

The first transmissive optical part 13 and the second transmissive optical part 14 in the present embodiment each have a quadrangular prismatic shape, and may have different shapes as long as the two optical elements each have a light incident surface and a light exiting surface parallel to each other.

The first transmissive optical part 13 has the same size as that of the second transmissive optical part 14 in FIG. 2, and may instead have shorter edges in the Y-axis direction than the edges in the X-axis direction and the Z-axis direction because the first transmissive optical part 13 scans the light modulator with the first light L1 in the Z-axis direction but not in the Y-axis direction, as will be described later. That is, the first transmissive optical part 13 may have a rectangular-box-like shape having edges in the Y-axis direction shorter than the edges in the X-axis direction and the Z-axis direction, in place of the substantially cubic shape shown in FIG. 2. The thickness of the first transmissive optical part 13 can thus be reduced. In this case, the dimensions of the second transmissive optical part 14 are greater than those of the first transmissive optical part 13, but can be made of a resin material because the light incident on the second transmissive optical part 14 has a low optical density as described above. When a resin material is used as the glass material of the translucent members, the second transmissive optical part 14 becomes lightweight, so that the size of the second driver 16 can be reduced.

At least one of the first transmissive optical part 13 and the second transmissive optical part 14 may be made of quartz. In each of the first transmissive optical part 13 and the second transmissive optical part 14, the amount of light absorbed by the translucent member increases as the amount of light passing through the translucent member increases, so that thermal strain is induced in the translucent member in some cases. In this case, the polarization direction of the illumination light LW output from the light source apparatus 10 is disturbed, and the linearly polarized light incident on the translucent member becomes elliptically polarized light and exits from the transparent member. The result is no effect of providing a predetermined contrast by using a laser diode as each of the light emitters 11B, 11G, and 11R of the light source apparatus 10 without providing a light-incident-side polarizer. That is, using a laser diode as each of the light emitters 11B, 11G, and 11R still requires using a light-incident-side polarizer to align polarization directions of the three types of color light with one another. To achieve the effect described above without using a light-incident-side polarizer, it is desirable to use a glass material having a small Young's modulus and a small coefficient of thermal expansion as a glass material causing only a small amount of thermal strain, for example, quartz.

The first fan 17 and the second fan 18 are each formed, for example, of a sirocco fan.

The first fan 17 includes a first housing 17*a* and a first blade part 17*b*.

The first housing 17*a* is a member that constitutes a fan main body, holds the first blade part 17*b*, and functions as an air guide member that guides the taken-in air. The first housing 17*a* has suction ports 17*a*1, via which air is sucked by the rotating first blade part 17*b*, and a discharge port 17*a*2, via which the air sucked via the suction ports 17*a*1 is discharged as the airflow K1 in the circumferential direction perpendicular to the axis of rotation of the first blade part 17*b*.

The first blade part 17*b* is coupled to the first transmissive optical part 13. Note that FIG. 2 shows the first blade part 17*b* and the first transmissive optical part 13 separate from each other for clarity.

The first driver 15 rotates the first blade part 17*b* along with the first transmissive optical part 13. That is, in the present embodiment, the first driver 15 serves as a drive source that drives both the first transmissive optical part 13 and the first fan 17.

The second fan 18 has the same configuration as that of the first fan 17. Specifically, the second fan 18 includes a second housing 18*a* and a second blade part 18*b*.

The second housing 18*a* is a member that constitutes a fan main body, holds the second blade part 18*b*, and functions as an air guide member that guides the taken-in air. The second housing 18*a* has a suction port 18*a*1, via which air is sucked by the rotating second blade part 18*b*, and a discharge port 18*a*2, via which the air sucked via the suction port 18*a*1 is discharged as the airflow K2 in the circumferential direction perpendicular to the axis of rotation of the second blade part 18*b*.

The second blade part 18*b* is coupled to the second transmissive optical part 14. Note that FIG. 2 shows the second blade part 18*b* and the second transmissive optical part 14 separate from each other for clarity.

The second driver 16 rotates the second blade part 18*b* along with the second transmissive optical part 14. That is, in the present embodiment, the second driver 16 serves as a drive source that drives both the second transmissive optical part 14 and the second fan 18.

The structure that couples the first driver 15, the first transmissive optical part 13, and the first fan 17 to each other will next be described. The structure that couples the second driver 16, the second transmissive optical part 14, and the second fan 18 to each other is the same as the structure that couples the first driver 15, the first transmissive optical part 13, and the first fan 17 to each other, and will therefore not be described.

The structure that couples the first driver 15, the first transmissive optical part 13, and the first fan 17 to each other is the same as the structure that couples the second driver 16, the second transmissive optical part 14, and the second fan 18 to each other. The structure that couples the first driver 15, the first transmissive optical part 13, and the first fan 17 to each other will be hereinafter described by way of example.

Figure 3:
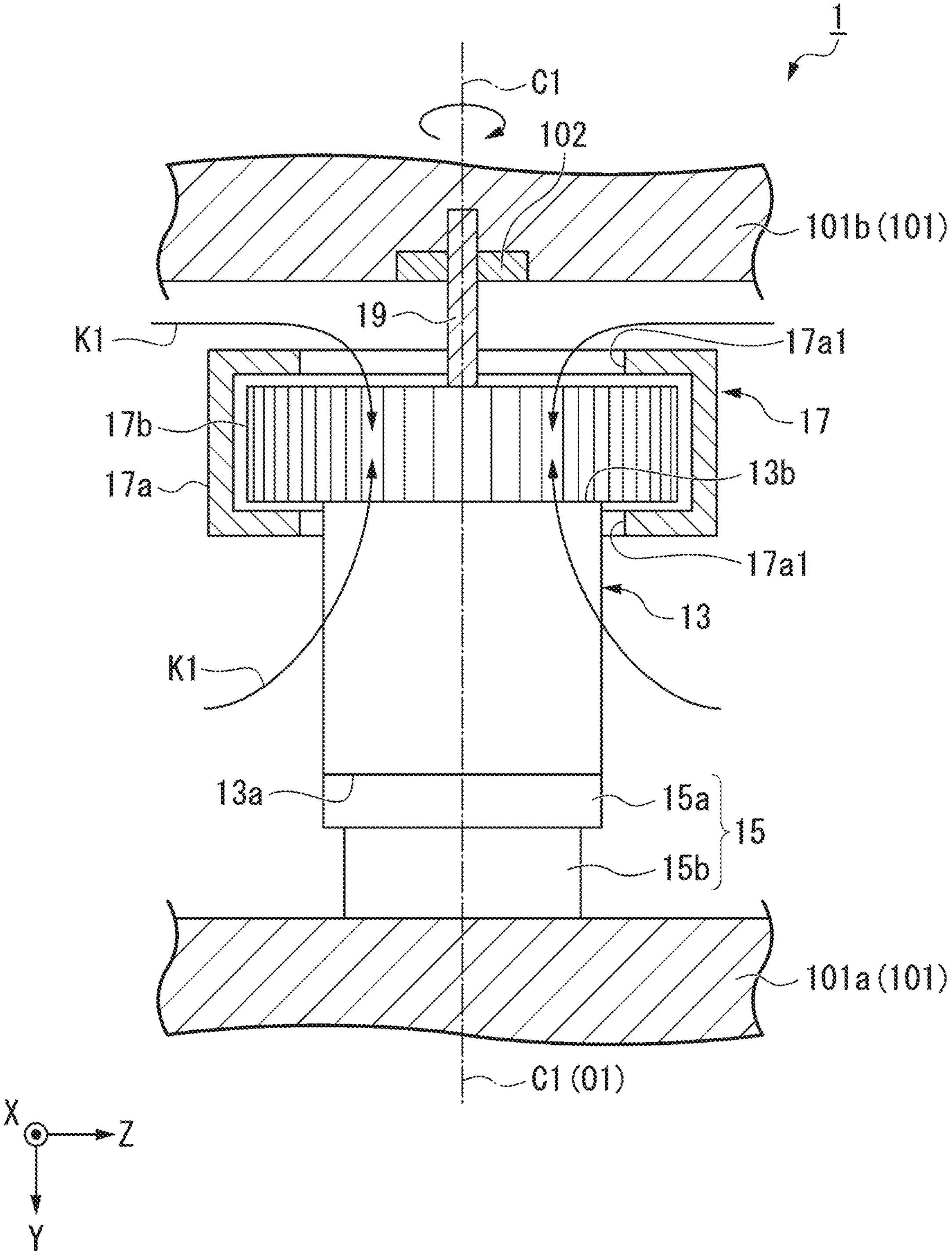
FIG. 3 shows the structure that couples a first driver, a first transmissive optical part, and a first fan to each other.

FIG. 3 shows the structure that couples the first driver 15, the first transmissive optical part 13, and the first fan 17 to each other.

The projector 1 further includes an enclosure 101, which supports the optical apparatus 20 and includes a first base 101*a* and a second base 101*b*, which are disposed so as to face each other, and a bearing 102, which is fixed to the second base 101*b*, as shown in FIG. 3. The enclosure 101 is a member that accommodates or holds each component inside the projector 1, and has a predetermined strength. Note that the enclosure 101 may constitute a part of the exterior of the projector 1.

The first driver 15 is coupled to the first surface 13*a* of the first transmissive optical part 13.

The first driver 15 includes a rotary shaft 15*a*, which rotates around an axis of rotation O1, and a main body 15*b*. The rotary shaft 15*a* of the first driver 15 is coupled to the first surface 13*a* of the first transmissive optical part 13. For example, an adhesive or screw fasteners are used to couple the rotary shaft 15*a* to the first surface 13*a*. The axis of rotation O1 of the rotary shaft 15*a* coincides with the first axis of rotation C1 of the first transmissive optical part 13.

The side of the first driver 15 that is opposite from the side facing the first transmissive optical part 13 is coupled to the first base 101*a*. Specifically, the main body 15*b* of the first driver 15 is coupled to the first base 101*a*.

The first blade part 17*b* of the first fan 17 is coupled to the second surface 13*b* of the first transmissive optical part 13. For example, an adhesive or screw fasteners are used to couple the first blade part 17*b* to the second surface 13*b*. The axis of rotation of the first blade part 17*b* coincides with the first axis of rotation C1 of the first transmissive optical part 13.

That is, the first driver 15 and the first blade part 17*b* are not provided at any of the side surfaces of the first transmissive optical part 13. According to the configuration described above, any of the side surfaces of the first transmissive optical part 13 can be used as the light incident surface or the light exiting surface.

The optical apparatus 20 further includes a shaft 19 fixed to an end of the first blade part 17*b* that is the end facing the −Y direction, which is the side opposite from the first transmissive optical part 13, in the Y-axis direction along the first axis of rotation C1. The bearing 102 is formed, for example, of a ball bearing and rotatably supports the shaft 19.

Based on the configuration described above, the first driver 15 can rotate the first transmissive optical part 13 around the first axis of rotation C1 by rotating the rotary shaft 15*a*. The first driver 15, which rotates the first transmissive optical part 13, can also rotate the first blade part 17*b* around the first axis of rotation C1 along with the first transmissive optical part 13.

Note that the first housing 17*a* of the first fan 17 is coupled in a region that is not shown to the enclosure 101.

Since the first driver 15 in the present embodiment is configured to rotate the first transmissive optical part 13 and the first blade part 17*b* integrated with each other as a rotor, the position of the center of gravity of the rotor is separate from the rotary shaft 15*a* of the first driver 15 in the Y-axis direction. When the position of the center of gravity of the rotor is separate from the rotary shaft 15*a* of the first driver 15 as described above, there is a concern about axis wobbling that occurs at the side of the rotator that is separate from the rotary shaft 15*a*.

In contrast, in the projector 1 according to the present embodiment, an end of the first blade part 17*b* that is the end facing the −direction Y, which is the side of the rotor that is opposite from the rotary shaft 15*a*, is supported by the second base 101*b* of the enclosure 101 via the shaft 19 and the bearing 102, as described above.

The thus configured projector 1 according to the present embodiment allows the opposite sides of the rotor in the axial direction in the first driver 15 to be rotatably supported by the enclosure 101. The projector 1 according to the present embodiment can therefore generate the airflow K1 by rotating the first blade part 17*b* of the first fan 17 while suppressing vibration or abnormal noise caused by the axis wobbling of the rotor rotated by the first driver 15.

The airflow K1 generated by the first fan 17 is sent to the first duct member 35 shown in FIG. 1. The first duct member 35 supplies the airflow K1 sent from the first fan 17 to the first heat absorbing member 31, the second heat absorbing member 32, and the third heat absorbing member 33 of the light source apparatus 10, which form the first heat generator of the projector 1 according to the present embodiment.

That is, the first fan 17 supplies the airflow K1 to the first heat absorbing member 31, the second heat absorbing member 32, and the third heat absorbing member 33 via the first duct member 35.

In the present embodiment, the heat dissipating fins 31*b*, 32*b*, and 33*b* of the heat absorbing members 31,32, and 33 are aligned with one another in the direction in which the airflow K1 is caused to flow through the first duct member 35.

In the present embodiment, the airflow K1 discharged toward the +Z direction is deflected by the first duct member 35 toward the −X direction.

According to the configuration described above, the heat dissipating fins 33*b*, 32*b*, and 31*b* corresponding to the red light LR, the green light LG, and the blue light LB can be sequentially arranged along an airflow K3 from upstream to downstream in descending order of strictness of the temperature management. Therefore, the airflow K1 having a low temperature can be supplied to the heat dissipating fins 33*b* corresponding to the red light LR, the temperature of which is strictly managed, and the airflow K1 having been heated to some extent can be supplied to the heat dissipating fins 31*b* corresponding to the blue light LB, the temperature of which is managed somewhat less strictly. Therefore, when the airflow K1 flowing in one direction is used, the heat dissipating fins 31*b*, 32*b*, and 33*b* of the heat absorbing members 31, 32, and 33 can be efficiently cooled.

Since the direction in which the airflow K1 generated by the first fan is exhausted is likely to depend on the direction in which the first transmissive optical part 13 is rotated, the direction in which the airflow K1 flows can be readily controlled by attaching the first duct member 35 to the discharge port 17*a*2 of the first fan 17.

The first housing 17*a* of the first fan 17 has the suction ports 17*a*1 at opposite sides in the axial direction. That is, the first fan 17 takes air into the first housing 17*a* via the opposite sides in the axial direction. The first fan 17 can therefore supply the airflow K1 toward the first transmissive optical part 13 by taking in air via the suction port 17*a*1 provided at the surface of the first housing 17*a* that faces the first transmissive optical part 13. The first fan 17 can therefore cool the first transmissive optical part 13 with the airflow K1.

Furthermore, in the projector 1 according to the present embodiment, the opposite sides of the rotor in the axial direction in the second driver 16 are rotatably supported by the enclosure 101. The projector 1 according to the present embodiment can therefore generate the airflow K2 by rotating the second blade part 18*b* of the second fan 18 while suppressing vibration or abnormal noise caused by the axis wobbling of the rotor rotated by the second driver 16.

The airflow K2 generated by the second fan 18 is sent to the second duct member 36 shown in FIG. 1. The second duct member 36 supplies the airflow K2 sent from the second fan 18 to the light modulator 21 and the light-exiting-side polarizer 22, which form the second heat generator of the projector 1 according to the present embodiment. The second fan 18 can therefore cool the light modulator 21 and the light-exiting-side polarizer 22 with the airflow K2.

The behavior of the illumination light LW passing through the first transmissive optical part 13 and the second transmissive optical part 14 will be described below. Since the first transmissive optical part 13 and the second transmissive optical part 14 provide the same effect in opposite directions, only the first transmissive optical part 13 will be described below with reference to the drawings.

FIGS. 4A to 4F are diagrammatic views that describe the behavior of the illumination light LW during the rotation of the first transmissive optical part 13. In this example, the first transmissive optical part 13 is rotated clockwise around the first axis of rotation C1 when viewed from the side facing the +Y direction, and time elapses in the direction from FIG. 4A toward FIG. 4F.

In FIGS. 4A to 4F, the angle between the illumination optical axis AX and a straight line M, which passes through the first axis of rotation C1 and is perpendicular to the first side surface 13*c*1 of the first transmissive optical part 13, is defined as an angle of rotation ω of the first transmissive optical part 13. Although the illumination light LW actually has a predetermined luminous flux width in the Z-axis direction, the behavior of the illumination light LW will be considered below by focusing on the behavior of a beam LWa traveling on the illumination optical axis AX.

Figure 4A:
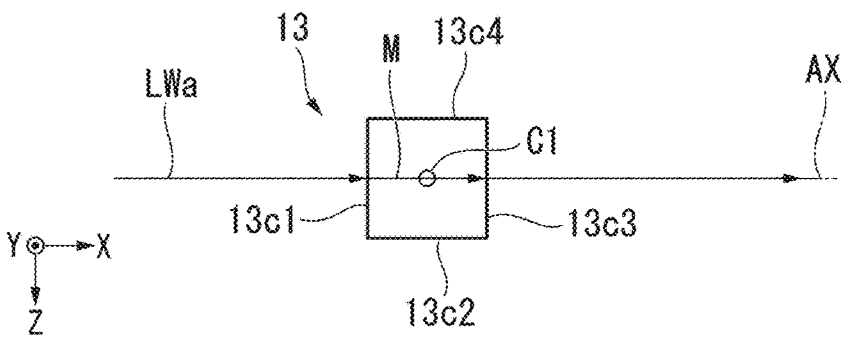
FIG. 4A is a diagrammatic view that describes the behavior of light during the rotation of the transmissive optical part.

FIG. 4A shows the initial state of the first transmissive optical part 13. That is, the first transmissive optical part 13 is not in motion, so that the straight line M overlaps with the illumination optical axis AX, and the angle of rotation ω is 0 degrees. In this case, since the beam LWa is incident on the first side surface 13*c*1 at right angles, the beam LWa is not refracted at the first side surface 13*c*1 but travels inside the first transmissive optical part 13 along the illumination optical axis AX. The beam LWa is then incident on the first side surface 13*c*3, which is parallel to the first side surface 13*c*1, at right angles again. The beam is therefore also not refracted at the first side surface 13*c*3, exits out of the first transmissive optical part 13, and travels on the illumination optical axis AX.

Figure 4B:
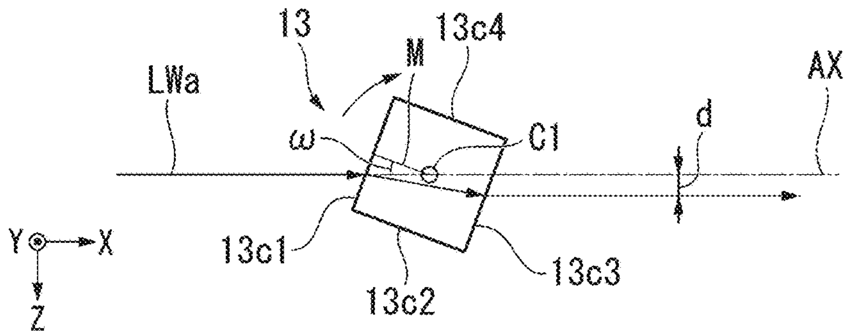
FIG. 4B is a diagrammatic view following FIG. 4A.

Thereafter, when the first transmissive optical part 13 is rotated by an angle of rotation ω, the beam LWa is incident on the first side surface 13*c*1 at an angle of incidence equal to the angle of rotation ω, as shown in FIG. 4B. The beam LWa is therefore refracted in the direction (toward +Z direction) shown in FIG. 4B and travels inside the first transmissive optical part 13. Since the beam LWa is then incident on the first side surface 13*c*3 at a predetermined angle of incidence, the beam LWa is refracted at the first side surface 13*c*3 and exits out of the first transmissive optical part 13. At this point in time, since the first side surface 13*c*1 and the first side surface 13*c*3 are parallel to each other, the angle of incidence of the beam LWa incident on the first side surface 13*c*1 and the angle of incidence of the beam LWa incident on the first side surface 13*c*3 are equal to each other, and the angle of refraction of the beam LWa incident on the first side surface 13*c*1 and the angle of refraction of the beam LWa exiting via the first side surface 13*c*3 are opposite in sign and have the same absolute value. The angle of refraction of the beam LWa incident on the first side surface 13*c*1 and the angle of refraction of the beam LWa exiting via the first side surface 13*c*3 cancel each other out. As a result, the beam LWa travels in parallel to the illumination optical axis AX but passes through the position displaced from the illumination optical axis AX toward the +Z direction by the amount of displacement d.

Figure 4C:
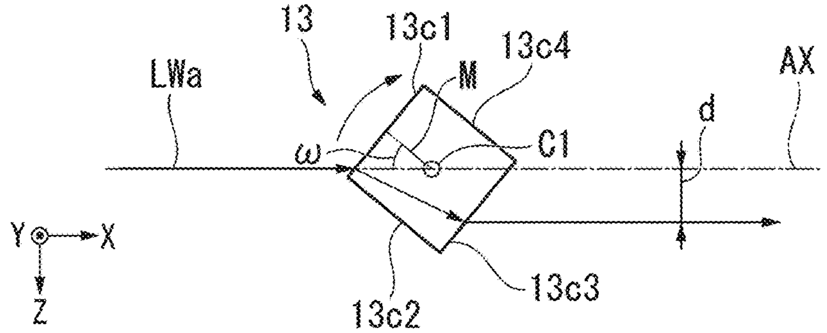
FIG. 4C is a diagrammatic view following FIG. 4B.

Thereafter, when the angle of rotation ω of the first transmissive optical part 13 increases from the value in FIG. 4B, the angle of incidence of the light beam LWa increases and the angle of refraction increases accordingly, as shown in FIG. 4C. The amount of displacement d of the beam LWa from the illumination optical axis AX therefore increases from the value in FIG. 4B. The state in which the beam LWa travels in parallel to the illumination optical axis AX is maintained all the time. When the angle of rotation ω is between 0 degrees and 45 degrees, the amount of displacement d monotonously increases as the angle of rotation ω increases.

Figure 4D:
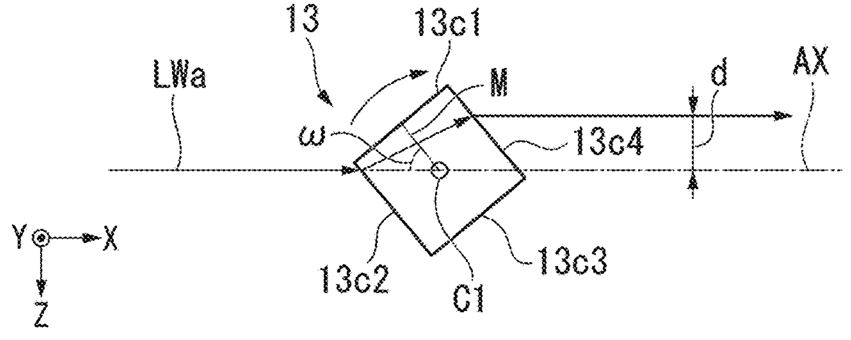
FIG. 4D is a diagrammatic view following FIG. 4C.

Thereafter, when the angle of rotation ω of the first transmissive optical part 13 exceeds 45 degrees, the surface on which the beam LWa is incident changes from the first side surface 13*c*1 to the first side surface 13*c*2, as shown in FIG. 4D. At this point in time, the beam LWa is refracted at the first side surface 13*c*2, and the direction in which the beam LWa is refracted changes from the direction during the period up to FIG. 4C, and the beam LWa is refracted in the direction shown in FIG. 4D (toward −Z direction). Furthermore, the surface via which the beam LWa exits also changes from the first side surface 13*c*3 to the first side surface 13*c*4, and the first side surface 13*c*2 and the first side surface 13*c*4 are parallel to each other, so that the situation in which the angle of refraction of the beam LWa incident on the first side surface 13*c*3 and the angle of refraction of the beam LWa exiting via the first side surface 13*c*4 cancel each other out remains the same as the situation during the period up to FIG. 4C. As a result, the beam LWa travels in parallel to the illumination optical axis AX but passes through the position displaced from the illumination optical axis AX toward the −direction Z by the amount of displacement d.

Figure 4E:
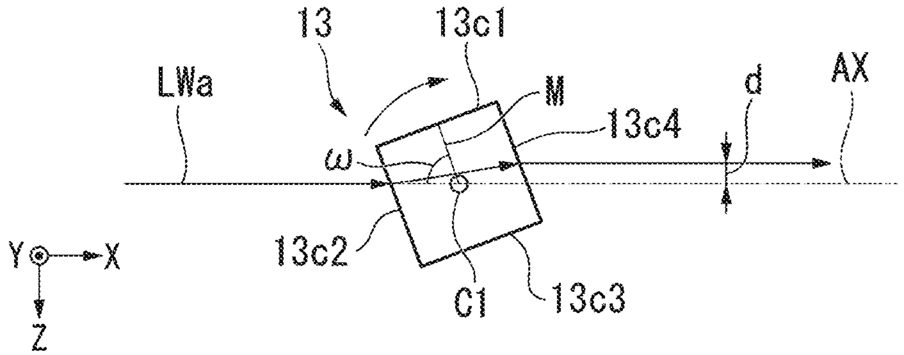
FIG. 4E is a diagrammatic view following FIG. 4D.

Thereafter, when the angle of rotation ω of the first transmissive optical part 13 increases from the value in FIG. 4D, the angle of incidence of the light beam LWa decreases and the angle of refraction decreases accordingly, as shown in FIG. 4E. The amount of displacement d of the beam LWa from the illumination optical axis AX therefore decreases from the value in FIG. 4D. As described above, when the angle of rotation ω is between 45 degrees and 90 degrees, the amount of displacement d monotonously decreases as the angle of rotation ω increases.

Figure 4F:
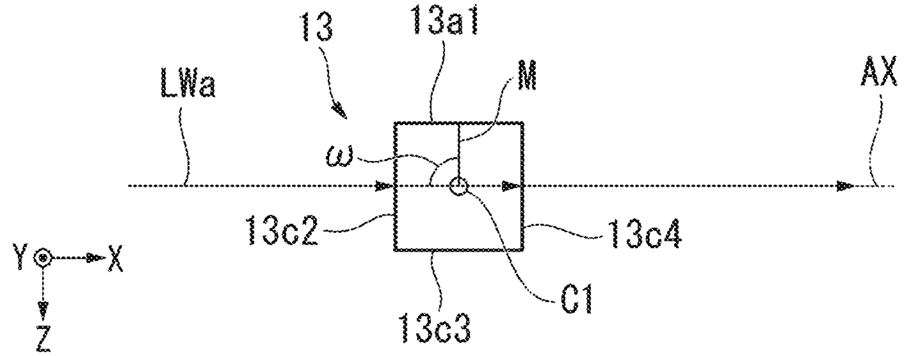
FIG. 4F is a diagrammatic view following FIG. 4E.

Thereafter, when the angle of rotation ω of the first transmissive optical part 13 reaches 90 degrees, the light incident surface changes from the first side surface 13*c*1 in the initial state to the first side surface 13*c*2, but the behavior of the beam LWa is the same as that in the initial state shown in FIG. 4A, as shown in FIG. 4F.

As described above, when the first light incident surface and the first light exiting surface of the first transmissive optical part 13 are parallel to each other, the traveling direction of the beam LWa does not change regardless of the angle of rotation ω of the first transmissive optical part 13, and is translated to the direction parallel to the illumination optical axis AX as the time elapses. When the angle of rotation ω is 0 degrees, the amount of displacement d of the beam LWa is 0, and when the angle of rotation ω is between 0 degrees and 45 degrees, the amount of displacement d increases toward one of the +Z direction and the −Z direction. At the moment when the angle of rotation ω exceeds 45 degrees, the absolute value of the amount of displacement d remains the same, but the displacement direction is reversed, when the angle of rotation ω is from 45 degrees to 90 degrees, the amount of displacement d decreases, and when the angle of rotation ω reaches 90 degrees, the amount of displacement d becomes 0. After the angle of rotation ω exceeds 90 degrees, the behavior described above is repeated. Therefore, when the first transmissive optical part 13 makes one rotation, the amount of displacement d of the beam LWa repeatedly undergoes the cycle described above four times. The amount of displacement of the beam LWa can be appropriately set by adjusting the refractive index, the size, and other parameters of the first transmissive optical part 13.

The displacement in only one direction caused by the first transmissive optical part 13 has been described above, and the light source apparatus 10 includes the first transmissive optical part 13 and the second transmissive optical part 14 having axes of rotation perpendicular to each other. The first light L1 is therefore displaced in two directions perpendicular to each other as the time elapses. Specifically, the first transmissive optical part 13 scans in the Z-axis direction the light modulator with the first light L1 emitted from the first light emitter 11, and the second transmissive optical part 14 scans the light modulator with the first light L1 in the Y-axis direction perpendicular to the Z-axis direction, as shown in FIG. 2. That is, the first transmissive optical part 13 and the second transmissive optical part 14 two-dimensionally scan the light modulation region 21*a* of the light modulator 21, which is the illumination receiving region, with the illumination light LW.

Effects of First Embodiment

The projector 1 according to the present embodiment includes a light source apparatus, a first heat generator that generates heat, and an optical apparatus that temporally displaces the optical path of the light output from the light source apparatus. The optical apparatus includes a first transmissive optical part that transmits and outputs the light incident from the light source apparatus, a first driver coupled to the first transmissive optical part and rotates the first transmissive optical part, and a first blade part coupled to the first transmissive optical part and generates an airflow that cools the first heat generator. The first transmissive optical part is rotated around a first axis of rotation along a second direction that intersects with a first direction in which the light output from the light source apparatus is incident to displace the optical path of the light. The first driver rotates the first blade part along with the first transmissive optical part to generate the airflow.

When a polygonal mirror is used to scan an object with light as in the related-art projector, the polygonal mirror reflects the light while rotating, so that the angle of incidence of the light incident on the illumination receiving surface continuously changes with time. Therefore, even when the light incident on the polygonal mirror is parallelized light, the light output from the polygonal mirror is divergent light, so that it is extremely difficult to cause the light to be incident on the illumination receiving surface at right angles all the time. Therefore, in the related-art projector including a polygonal mirror, brightness and contrast at the light modulator decrease, color unevenness occurs, the light is lost at the projection optical apparatus, and other disadvantages occur, so that the quality of an image from the projector may deteriorate.

To address the problem described above, the projector 1 according to the present embodiment rotates the first transmissive optical part 13 and the second transmissive optical part 14 to displace the illumination light LW in the direction perpendicular to the traveling direction of the illumination light LW with the illumination light LW maintained parallel to the illumination optical axis AX, as shown in FIGS. 4A to 4F. In addition, providing the first transmissive optical part 13 and the second transmissive optical part 14 having the axes of rotation C1 and C2 perpendicular to each other allows a two-dimensional illumination receiving region Q of any illumination receiving surface to be scanned with the illumination light LW. The projector 1 can thus cause the light to be incident on the light modulator 21 substantially at right angles. The projector 1 according to the present embodiment can therefore be a projector that excels in display quality resulting from suppression of a decrease in brightness and contrast at the light modulator 21, color unevenness, loss of the light at the projection optical apparatus 23, and other disadvantages.

In addition, the projector 1 according to the present embodiment can generate the airflow K1, which cools each of the heat absorbing members 31, 32, and 33 provided as the first heat generator in the light source apparatus 10, by using the drive power produced by the first driver 15, which rotates the first transmissive optical part 13. The projector 1, in which the first driver 15 is also used as the driver that drives the first transmissive optical part 13 and the first blade part 17*b*, can therefore be made more compact than in a case where the driver that drives the first transmissive optical part 13 and the first blade part 17*b* is separately provided.

The projector 1 according to the present embodiment can further generate the airflow K2, which cools the light modulator 21 and the light-exiting-side polarizer 22, which form the second heat generator, by using the drive power produced by the second driver 16, which rotates the second transmissive optical part 14. The size of the projector 1 according to the present embodiment, which also uses the second driver 16 as a driver that drives the second transmissive optical part 14 and the second blade part 18*b*, can therefore be further reduced.

Second Embodiment

Figure 5:
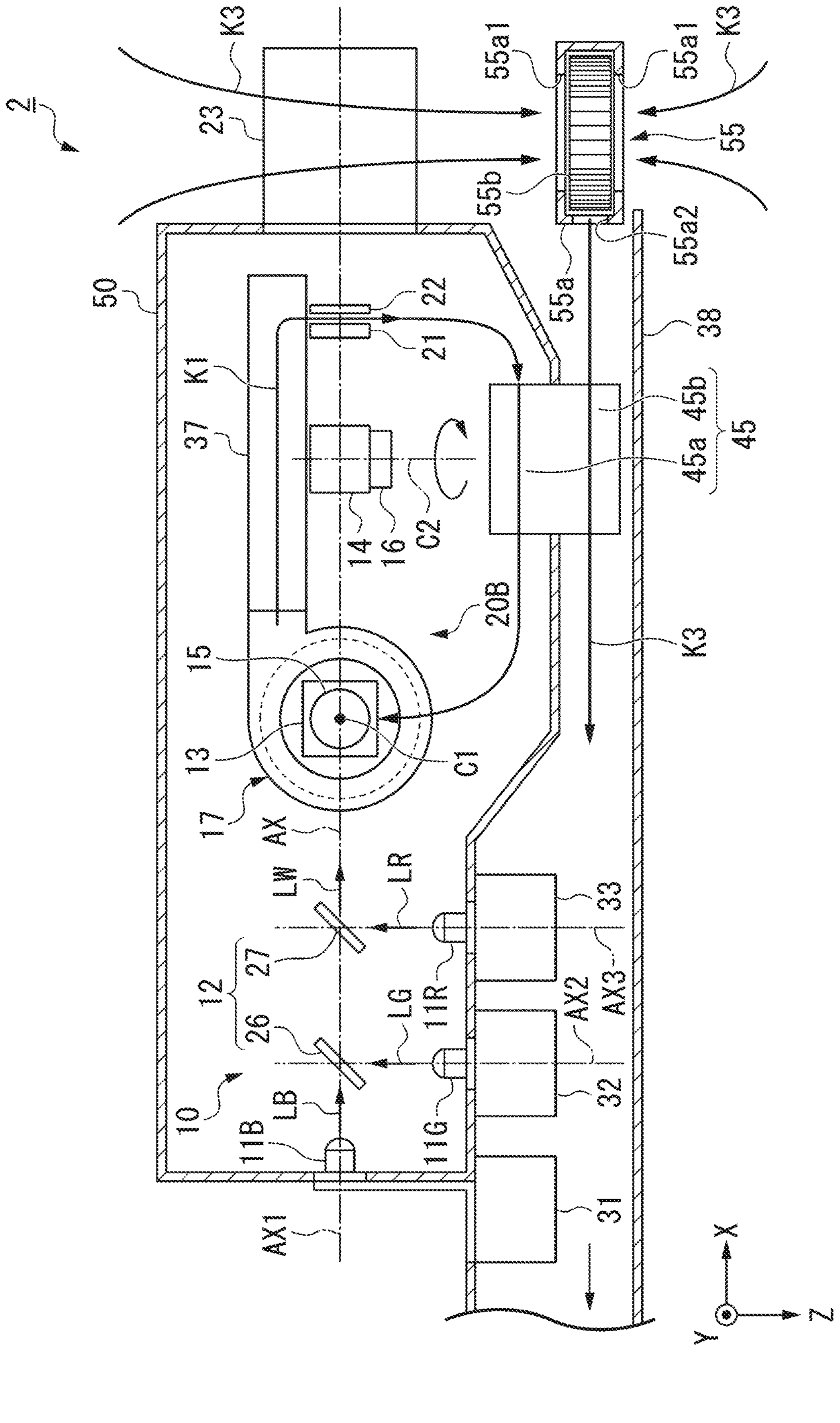
FIG. 5 is a plan view showing a schematic configuration of the projector according to a second embodiment.

The configuration of the projector according to a second embodiment will be subsequently described. Components common to those in the first embodiment have the same reference characters and will not be described. FIG. 5 is a plan view showing a schematic configuration of a projector 2 according to the present embodiment.

The projector 2 according to the present embodiment includes a sealed enclosure 50, the light source apparatus 10, an optical apparatus 20B, a third duct member 37, a fourth duct member 38, the light modulator 21, the light-exiting-side polarizer 22, the projection optical apparatus 23, a heat exchanger 45, and a third fan 55, as shown in FIG. 5. The optical apparatus 20B includes the first transmissive optical part 13, the second transmissive optical part 14, the first driver 15, the second driver 16, and the first fan 17.

The projector 2 according to the present embodiment includes the light modulator 21 and the light-exiting-side polarizer 22 as the first heat generator.

The sealed enclosure 50 hermetically accommodates the light modulator 21 and the light-exiting-side polarizer 22, which form the first heat generator, a part of the light source apparatus 10, the optical apparatus 20B, the third duct member 37, and a part of the heat exchanger 45. Adhesion of foreign matter such as dust and dirt to the components in the sealed enclosure 50 can thus be suppressed.

Out of the portions that constitute the light source apparatus 10, the first light emitter 11B, the second light emitter 11G, the third light emitter 11R, and the light combining system 12 are accommodated in the sealed enclosure 50, and the first heat absorbing member 31, the second heat absorbing member 32, and the third heat absorbing member 33 coupled to the light emitters 11B, 11G, and 11R are disposed outside the sealed enclosure 50. In the present embodiment, the first light emitter 11B, the second light emitter 11G, and the third light emitter 11R are fitted into openings through a wall surface of the sealed enclosure 50 to form a sealed interior. The first heat absorbing member 31, the second heat absorbing member 32, and the third heat absorbing member 33 are provided so as to be in contact with the first light emitter 11B, the second light emitter 11G, and the third light emitter 11R, respectively, which are exposed through the wall surface of the sealed enclosure 50.

Apart of the heat exchanger 45 is disposed outside the sealed enclosure 50. The sealed enclosure 50 has a light transmissive portion that transmits light at a position where the light transmissive portion faces the light-exiting-side polarizer 22. The projection optical apparatus 23 is provided at the light transmissive portion of the sealed enclosure 50, enlarges the image light modulated by the light modulator 21, and projects the enlarged image light toward a projection receiving surface, such as a screen.

The airflow K1 generated by the first fan 17 is sent to the third duct member 37 in the sealed enclosure 50. The third duct member 37 supplies the airflow K1 sent from the first fan 17 to the light modulator 21 and the light-exiting-side polarizer 22, which form the first heat generator of the projector 2 according to the present embodiment. The airflow K1 having cooled the light modulator 21 and the light-exiting-side polarizer 22 and therefore having been heated comes into contact with the heat exchanger 45 disposed in the sealed enclosure 50.

The heat exchanger 45 includes a heat absorber 45*a*, which absorbs the heat from the airflow K1 flowing in the sealed enclosure 50, and a heat dissipater 45*b* disposed outside the sealed enclosure 50. The heat absorber 45*a* and the heat dissipater 45*b* each have, for example, a heat sink structure including a plurality of fins.

The third fan 55 is disposed outside the sealed enclosure 50. The third fan 55 is formed, for example, of a sirocco fan. The third fan 55 includes a third housing 55*a*, a third blade part 55*b*, and a driver that is not shown. The third housing 55*a* has suction ports 55*a*1, via which air is sucked by the rotating third blade part 55*b*, and a discharge port 55*a*2, via which the air sucked via the suction ports 55*a*1 is discharged as the airflow K3 in the circumferential direction perpendicular to the axis of rotation of the third blade part 55*b*. The third fan 55 is a fan different from the first fan 17, and has an independent drive source. Therefore, the third fan 55 can be independently driven regardless of whether the first fan 17 is driven, and rotates at an any rotation speed different, for example, from the rotation speed of the first fan 17.

In the projector 2 according to the present embodiment, the third fan 55 is disposed in the vicinity of the projection optical apparatus 23. The third housing 55*a* of the third fan 55 has suction ports 55*a*1 at opposite sides in the axial direction along the axis of rotation of the third fan 55. That is, the third fan 55 takes air into the housing 55*a* via the opposite sides thereof in the axial direction. The third fan 55 can therefore generate the airflow K3 along the projection optical apparatus 23 by taking in air via the suction port 55*a*1 provided at the surface of the third housing 55*a* that faces the projection optical apparatus 23. The third fan 55 can therefore cool the projection optical apparatus 23 with the airflow K3.

The airflow K3 generated by the third fan 55 is sent to the fourth duct member 38. The fourth duct member 38 guides the airflow K3 sent from the third fan 55 along the surface of the sealed enclosure 50. The heat absorber 45*a* of the heat exchanger 45, the first heat absorbing member 31, the second heat absorbing member 32, and the third heat absorbing member 33 are disposed inside the fourth duct member 38. In the fourth duct member 38, the heat absorber 45*a*, the third heat absorbing member 33, the second heat absorbing member 32, and the first heat absorbing member 31 are arranged in this order in the direction in which the airflow K3 flows from upstream toward downstream.

The heat exchanger 45 therefore lowers the temperature of the airflow K1 flowing in the sealed enclosure 50 by exchanging the heat between the airflow K1 flowing in the sealed enclosure 50 and the airflow K3 flowing in the fourth duct member 38. The airflow K1 cooled in the heat exchanger 45 is sucked again into the first fan 17, and therefore sent as cooling air to the third duct member 37. The airflow K1 generated by the first fan 17 thus circulates in the sealed enclosure 50.

The projector 2 according to the present embodiment can supply the airflow K3 having a low temperature to the heat dissipating fins 33*b* corresponding to the red light LR, the temperature of which is strictly managed, and the airflow K3 having been heated to some extent to the heat dissipating fins 31*b* corresponding to the blue light LB, the temperature of which is managed somewhat less strictly. Therefore, when the airflow K3 flowing in one direction is used, the heat dissipating fins 31*b*, 32*b*, and 33*b* of the heat absorbing members 31, 32, and 33 can be efficiently cooled.

In the projector 2 according to the present embodiment, since the third fan 55 can be driven independently of the first fan 17, for example, increasing the rotation speed of the third fan 55 increases the cooling performance of the heat exchanger 45, so that the airflow K1 having a low temperature can be stably supplied to the first heat generator. That is, in the projector 2 according to the present embodiment, the first heat generator can be efficiently cooled by increasing the rotation speed of the third fan 55.

In the projector 2 according to the present embodiment, to increase the performance by which the first heat generator is cooled, it is not necessary to change the rotation speed of the first fan 17, that is, the rotation speed of the first driver 15, which drives the first blade part 17*b* of the first fan 17. Therefore, to increase the performance by which the first heat generator is cooled, the rotation speed of the first transmissive optical part 13 coupled to the first driver 15 is not changed, so that the projection image is not affected.

The airflow K3 having cooled the heat exchanger 45 passes through the fourth duct member 38 and sequentially cools the third heat absorbing member 33, the second heat absorbing member 32, and the first heat absorbing member 31. The airflow K3 is slightly heated through the heat exchange with the heat exchanger 45, but has a temperature sufficiently lower than the heat absorbing members 33, 32, and 31 to be cooled. The airflow K3 having cooled the heat exchanger 45 can therefore efficiently cool the heat absorbing members 33, 32, and 31.

In the projector 2 according to the present embodiment, the first driver 15, which rotates the first transmissive optical part 13, can also be used as the drive source that drives the first fan 17 to cool the light modulator 21 and the light-exiting-side polarizer 22 as the first heat generator in the sealed enclosure 50. The projector 2 according to the present embodiment can therefore have an apparatus configuration smaller than that required when a drive source that drives the first fan 17 is separately provided.

In addition, the projector 2 according to the present embodiment, in which the third fan 55 is driven to increase the cooling performance of the heat exchanger 45, can lower the temperature of the airflow K1, which circulates in the sealed enclosure 50 and is delivered to the first heat generator, without any change in the conditions under which the first driver 15 is driven. Changing the conditions under which the first driver 15 is driven causes a problem of necessity of changing the rotation speed of the second transmissive optical part 14, the conditions under which the light modulator 21 is driven, and other parameters in correspondence with the change in the rotation speed of the first transmissive optical part 13, but the projector 2 according to the present embodiment does not cause such a problem.

Third Embodiment

Figure 6:
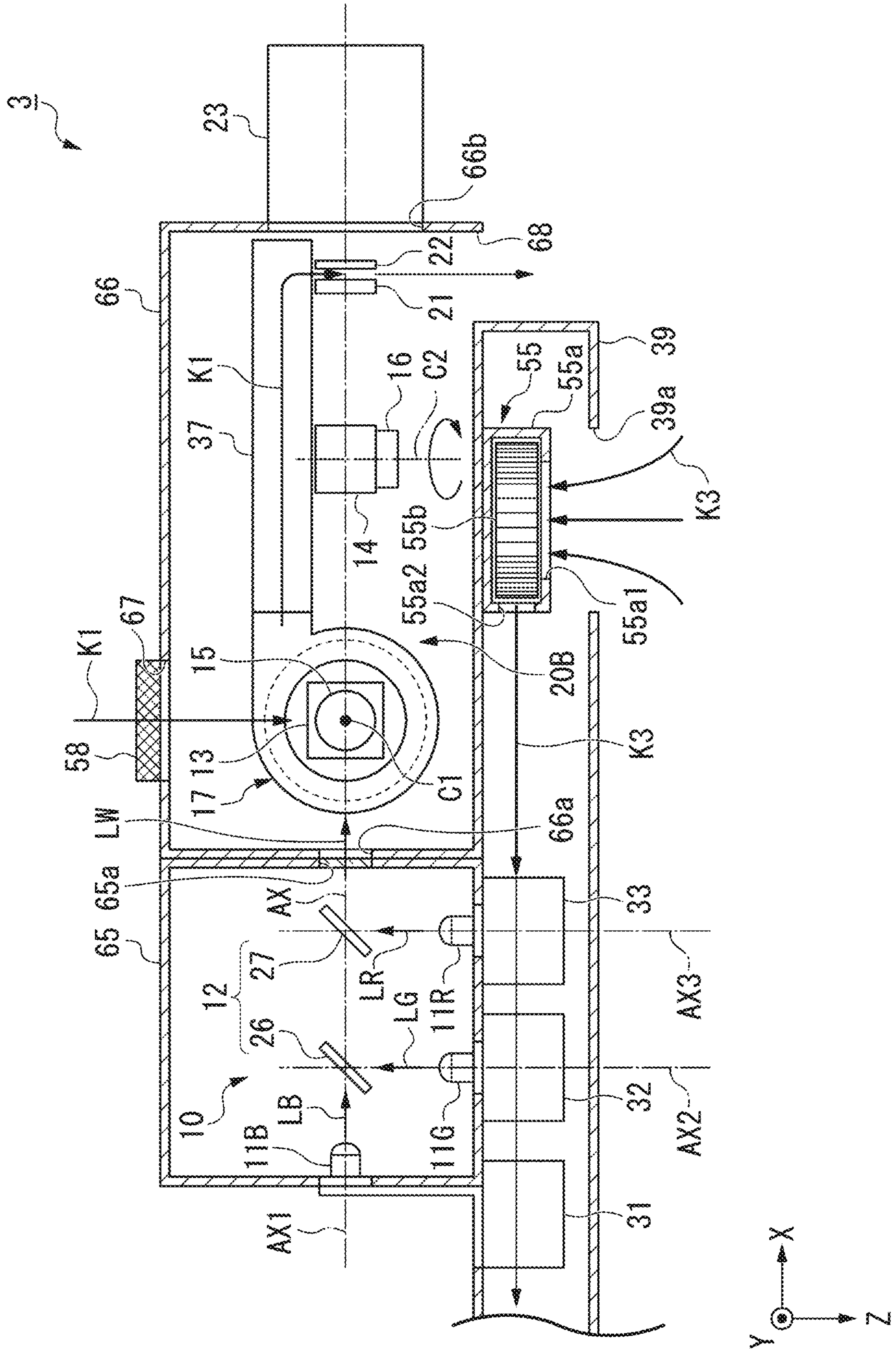
FIG. 6 is a plan view showing a schematic configuration of the projector according to a third embodiment.

The configuration of the projector according to a third embodiment will be subsequently described. Components common to those in the second embodiment have the same reference characters and will not be described. FIG. 6 is a plan view showing a schematic configuration of a projector 3 according to the present embodiment.

The projector 3 according to the present embodiment includes a first enclosure 65, a second enclosure 66, the light source apparatus 10, the optical apparatus 20B, the third duct member 37, a fifth duct member 39, the light modulator 21, the light-exiting-side polarizer 22, the projection optical apparatus 23, the third fan 55, and a filter 58, as shown in FIG. 6. The optical apparatus 20B includes the first transmissive optical part 13, the second transmissive optical part 14, the first driver 15, the second driver 16, and the first fan 17.

The projector 3 according to the present embodiment includes the light modulator 21 and the light-exiting-side polarizer 22 as the first heat generator.

The first enclosure 65 hermetically accommodates the first light emitter 11B, the second light emitter 11G, the third light emitter 11R, and the light combining system 12 out of the portions that constitute the light source apparatus 10. At least a part of each of the first heat absorbing member 31, the second heat absorbing member 32, and the third heat absorbing member 33 is disposed outside the first enclosure 65. The first enclosure 65 has a light extraction window 65*a*, through which the illumination light LW as the result of the light combining operation performed by the light combining system 12 exits.

The second enclosure 66 is disposed adjacent to the first enclosure 65 on the illumination optical axis AX. The second enclosure 66 is provided with a light transmissive section 66*a*, which transmits light, at a position where the light transmissive section 66*a* faces the light extraction window 65*a* of the first enclosure 65. The second enclosure 66 takes in the illumination light LW output from the light combining system 12, which is accommodated in the first enclosure 65, via the light transmissive section.

The second enclosure 66 non-hermetically accommodates the light modulator 21 and the light-exiting-side polarizer 22, which form the first heat generator, the optical apparatus 20B, and the third duct member 37. The second enclosure 66 has a light transmissive portion that transmits light at a position where the light transmissive portion faces the light-exiting-side polarizer 22. The projection optical apparatus 23 is provided at the light transmissive portion 66*b* of the second enclosure 66, enlarges the image light output from the light-exiting-side polarizer 22, and displays the enlarged image light on a projection receiving surfaces, such as a screen. The second enclosure 66 has an intake port 67, through which the first fan 17 accommodated in the second enclosure 66 takes in air, and an exhaust port 68.

The first fan 17 generates the airflow K1 by taking in air via the intake port 67 of the second enclosure 66. In the present embodiment, the filter 58 is provided at the intake port 67 of the second enclosure 66. The filter 58 collects dirt and dust contained in the air passing through the intake port 67. The first fan 17 can thus supply the second enclosure 66 with a highly clean airflow K1.

The airflow K1 generated by the first fan 17 is sent to the third duct member 37 in the second enclosure 66. The third duct member 37 supplies the airflow K1 sent from the first fan 17 to the light modulator 21 and the light-exiting-side polarizer 22, which form the first heat generator of the projector 3 according to the present embodiment. The airflow K1 having cooled the light modulator 21 and the light-exiting-side polarizer 22 and therefore having been heated is exhausted out of the second enclosure 66 via the exhaust port 68 provided as a port of the second enclosure 66. An increase in the temperature in the second enclosure 66 is thus suppressed.

The third fan 55 is disposed outside the second enclosure 66. The airflow K3 generated by the third fan 55 is sent to the fifth duct member 39. The fifth duct member 39 has an intake port 39*a* provided at the surface facing the third fan 55, and guides the airflow K3 taken in via the intake port 39*a* along the surfaces of the second enclosure 66 and the first enclosure 65. The third heat absorbing member 33, the second heat absorbing member 32, and the first heat absorbing member 31 are disposed in this order inside the fifth duct member 39.

In the projector 3 according to the present embodiment, the first driver 15, which rotates the first transmissive optical part 13, can also be used as the drive source that drives the first fan 17 to cool the light modulator 21 and the light-exiting-side polarizer 22 as the first heat generator in the second enclosure 66. The projector 3 according to the present embodiment can therefore have an apparatus configuration smaller than that required when a drive source that drives the first fan 17 is separately provided.

The projector 3 according to the present embodiment, which takes in the outside air into the second enclosure 66 to generate the airflow K1, allows cost reduction by omitting the heat exchanger 45 in the second embodiment.

The projector 3 according to the present embodiment can efficiently cool each of the heat absorbing members 31, 32, and 33 by driving the third fan 55. The projector 3 according to the present embodiment can thus project a bright image by suppressing an increase in the temperature of each of the light emitters 11B, 11G, and 11R to keep the intensity of the emitted light constant.

The projector 3 according to the present embodiment can supply the airflow K3 having a low temperature to the heat dissipating fins 33*b* corresponding to the red light LR, the temperature of which is strictly managed, and the airflow K3 having been heated to some extent to the heat dissipating fins 31*b* corresponding to the blue light LB, the temperature of which is managed somewhat less strictly. Therefore, when the airflow K3 flowing in one direction is used, the heat dissipating fins 31*b*, 32*b*, and 33*b* of the heat absorbing members 31, 32, and 33 can be efficiently cooled.

Fourth Embodiment

Figure 7:
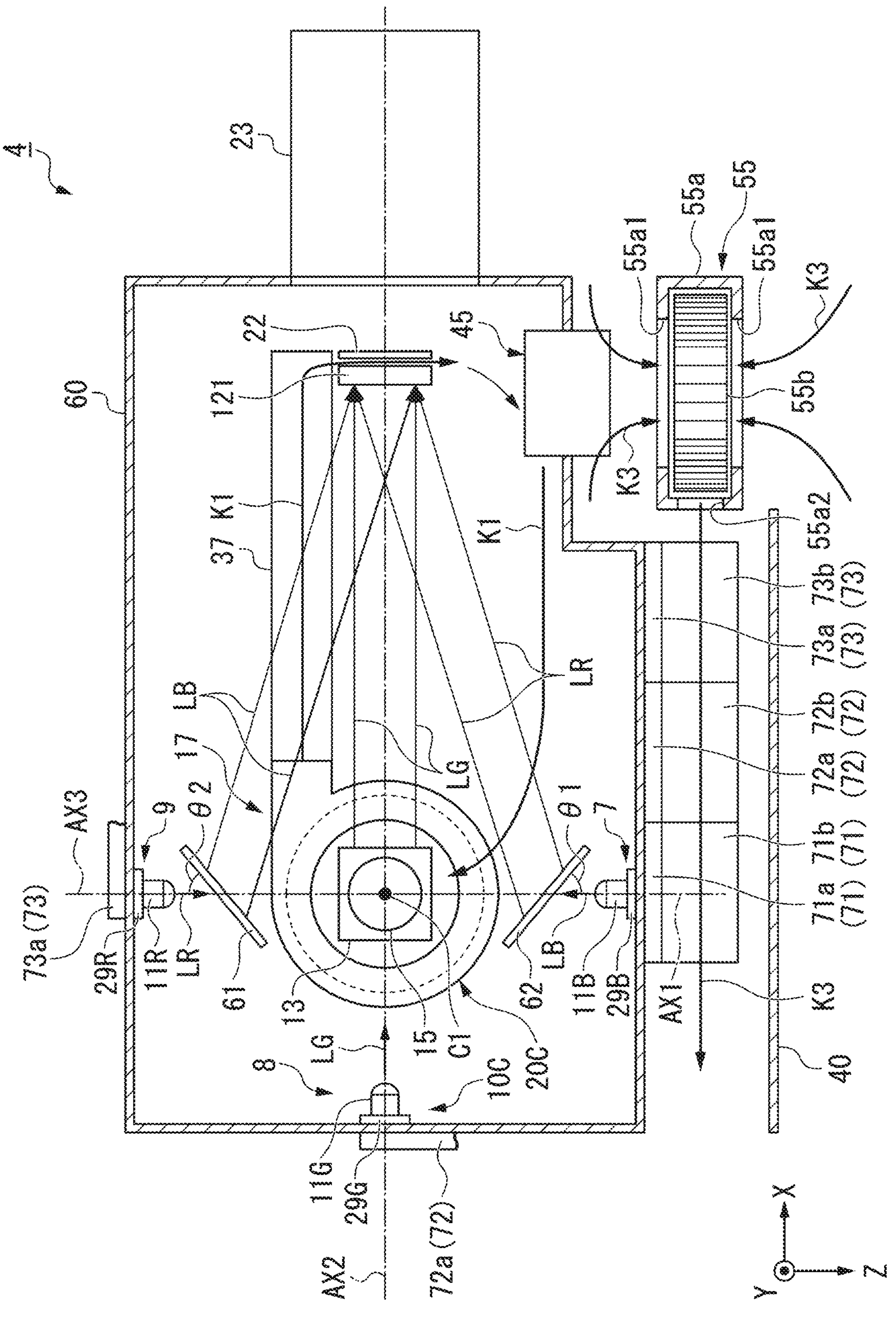
FIG. 7 is a plan view showing a schematic configuration of the projector according to a fourth embodiment.

The configuration of the projector according to a fourth embodiment will be subsequently described. Components common to those in the first embodiment have the same reference characters and will not be described. FIG. 7 is a plan view showing a schematic configuration of a projector 4 according to the present embodiment.

The projector 4 according to the present embodiment includes a sealed enclosure 60, a light source apparatus 10C, an optical apparatus 20C, the third duct member 37, a sixth duct member 40, a light modulator 121, the light-exiting-side polarizer 22, the projection optical apparatus 23, the heat exchanger 45, and the third fan 55, as shown in FIG. 7.

The projector 4 according to the present embodiment includes the light modulator 121 and the light-exiting-side polarizer 22 as the first heat generator.

The sealed enclosure 60 hermetically accommodates the light modulator 121 and the light-exiting-side polarizer 22, which form the first heat generator, a part of the light source apparatus 10C, the optical apparatus 20C, the third duct member 37, and a part of the heat exchanger 45.

The light source apparatus 10C includes a first light source section 7, a second light source section 8, a third light source section 9, a first heat absorbing member 71, a second heat absorbing member 72, a third heat absorbing member 73, a first reflector 61, and a second reflector 62. The optical apparatus 20C includes the first transmissive optical part 13, the first driver 15, and the first fan 17.

Out of the portions that constitute the light source apparatus 10C, the first light source section 7, the second light source section 8, the third light source section 9, the first reflector 61, and the second reflector 62 are accommodated in the sealed enclosure 60, and the first heat absorbing member 71, the second heat absorbing member 72, and the third heat absorbing member 73 coupled to the light source sections 7, 8, and 9 are disposed outside the sealed enclosure 60.

Apart of the heat exchanger 45 is disposed outside the sealed enclosure 60. The sealed enclosure 60 has a light transmissive portion that transmits light at a position where the light transmissive portion faces the light-exiting-side polarizer 22. The projection optical apparatus 23 is provided at the light transmissive portion of the sealed enclosure 60, enlarges the image light modulated by the light modulator 121, and projects the enlarged image light toward a projection receiving surface, such as a screen.

The first light source section 7 outputs the blue light LB toward the first transmissive optical part 13 (−Z direction). The second light source section 8 outputs the green light LG toward the first transmissive optical part 13 (−X direction). The third light source section 9 outputs the red light LR toward the first transmissive optical part 13 (+Z direction).

The optical axis AX1 of the first light source section 7 and the optical axis AX3 of the third light source section 9 are located on the same axis. The optical axis AX2 of the second light source section 8 is perpendicular to the optical axis AX1 of the first light source section 7 and the optical axis AX3 of the third light source section 9.

The first light source section 7 is formed of a plurality of first light emitters 11B arranged in line on a substrate 29B along the Y-axis direction at predetermined intervals. The first light source section 7 in the present embodiment outputs the blue light LB containing the beams from the first light emitters 11B arranged in the Y-axis direction. The blue light LB in the present embodiment therefore has a band-shaped cross-sectional shape perpendicular to the chief ray thereof and having a major axis extending along the Y-axis direction and a minor axis extending along the X-axis direction.

The second light source section 8 is formed of a plurality of second light emitters 11G arranged in line on a substrate 29G along the Y-axis direction at predetermined intervals. The second light source section 8 in the present embodiment outputs the green light LG containing the beams from the second light emitters 11G arranged in the Y-axis direction. The green light LG output by the second light source section 8 therefore has a band-shaped cross-sectional shape perpendicular to the chief ray thereof and having a major axis extending along the Y-axis direction and a minor axis extending along the Z-axis direction.

The third light source section 9 is formed of a plurality of third light emitters 11R arranged in line on a substrate 29R along the Y-axis direction at predetermined intervals. The third light source section 9 in the present embodiment outputs the red light LR containing the beams from the third light emitters 11R arranged in the Y-axis direction. The red light LR output by the third light source section 9 therefore has a band-shaped cross-sectional shape perpendicular to the chief ray thereof and having a major axis extending along the Y-axis direction and a minor axis extending along the X-axis direction.

The first heat absorbing member 71 is a member that absorbs the heat generated in each of the light emitter 11B of the first light source section 7. In the present embodiment, the first heat absorbing member 71 is thermally coupled to the first light emitters 11B via a wall surface of the sealed enclosure 60. The first heat absorbing member 71 includes a heat pipe 71*a* thermally coupled to the substrate 29B of the first light source section 7, and a plurality of heat dissipating fins 71*b* provided at the heat pipe 71*a*. The heat pipe 71*a* of the first heat absorbing member 71 is so routed that the heat dissipating fins 71*b* of the first heat absorbing member 71 are disposed at predetermined positions outside the sealed enclosure 60.

The second heat absorbing member 72 is a member that absorbs the heat generated in each of the light emitters 11G of the second light source section 8. In the present embodiment, the second heat absorbing member 72 is thermally coupled to the second light emitters 11G via the wall surface of the sealed enclosure 60. The second heat absorbing member 72 includes a heat pipe 72*a* thermally coupled to the substrate 29G of the second light source section 8, and a plurality of heat dissipating fins 72*b* provided at the heat pipe 72*a*. The heat pipe 72*a* of the second heat absorbing member 72 is so routed that the heat dissipating fins 72*b* of the second heat absorbing member 72 are disposed at predetermined positions outside the sealed enclosure 60.

The third heat absorbing member 73 is a member that absorbs the heat generated in each of the light emitters 11R of the third light source section 9. In the present embodiment, the third heat absorbing member 73 is thermally coupled to the third light emitters 11R via the wall surface of the sealed enclosure 60. The third heat absorbing member 73 includes a heat pipe 73*a* thermally coupled to the substrate 29R of the third light source section 9, and a plurality of heat dissipating fins 73*b* provided at the heat pipe 73*a*. The heat pipe 73*a* of the third heat absorbing member 73 is so routed that the heat dissipating fins 73*b* of the third heat absorbing member 73 are disposed at predetermined positions outside the sealed enclosure 60.

In the present embodiment, the blue light LB, the green light LG, and the red light LR are incident on different positions on the first transmissive optical part 13. In the present embodiment, in particular, since the first light source section 7, the second light source section 8, and the third light source section 9 are located so as to be angularly separate by 90 degrees around the intersection of the optical axes AX1, AX2, and AX3, the blue light LB, the green light LG, and the red light LR are incident on different side surfaces of the first transmissive optical part 13.

The green light LG is linearly elongated in the Y-axis direction perpendicular to the Z-axis direction, in which the green light LG is displaced. The two-dimensional illumination receiving region Q of the illumination receiving surface (light modulator 121) is therefore scanned with the green light LG. Although the directions in which the blue light LB and the red light LR are output differ from the direction in which the green light LG is output, the blue light LB and the red light LR are reflected off respective reflectors 61 and 62, which will be described later, and the two-dimensional illumination receiving region Q of the illumination receiving surface (light modulator 121) is then scanned with the blue light LB and the red light LR, as the two-dimensional illumination receiving region Q is scanned with the green light LG. As described above, the transmissive optical part 13, when rotated around the axis of rotation C1, scans the two-dimensional illumination receiving region Q of the illumination receiving surface with the blue light LB, the green light LG, and the red light LR in the direction perpendicular to the Y-axis direction.

The second reflector 62 is provided in the optical path of the blue light LB, which is output from the first light source section 7, between the first light source section 7 and the first transmissive optical part 13. The first reflector 61 is formed of a dichroic mirror that reflects the red light and transmits the blue light. The first reflector 61 therefore reflects the red light LR output from the transmissive optical part 13 and transmits the blue light LB output from the first light source section 7. The angle between the first reflector 61 and the Z-axis is referred to as an inclination angle θ1 of the first reflector 61. The inclination angle θ1 of the first reflector 61 is greater than 45 degrees.

The first reflector 61 is provided in the optical path of the red light LR, which is output from the third light source section 9, between the third light source section 9 and the first transmissive optical part 13. The second reflector 62 is formed of a dichroic mirror that reflects the blue light and transmits the red light. The second reflector 62 therefore reflects the blue light LB output from the first transmissive optical part 13 and transmits the red light LR output from the third light source section 9. The angle between the second reflector 62 and the Z-axis is referred to as an inclination angle θ2 of the second reflector 62. The inclination angle θ2 of the second reflector 62 is greater than 45 degrees.

Since the inclination angle θ2 of the second reflector 62 is set at a value greater than 45 degrees, the blue light LB reflected off the second reflector 62 travels obliquely with respect to and toward the optical axis AX2. Similarly, since the inclination angle θ1 of the first reflector 61 is set at a value greater than 45 degrees, the red light LR reflected off the first reflector 61 travels obliquely with respect to and toward the optical axis AX2.

The blue light LB reflected off the second reflector 62, the green light LG output from the first transmissive optical part 13, and the red light LR reflected off the first reflector 61 are therefore incident in different directions on a first microlens array 43 upstream from the light modulator 121 and are superimposed on one another on the first microlens array 43, as will be described later. In the present embodiment, the angle of incidence of the green light LG incident on the first microlens array 43 is 0 degrees. In other words, the green light LG is incident on the first microlens array 43 at right angles.

Figure 8:
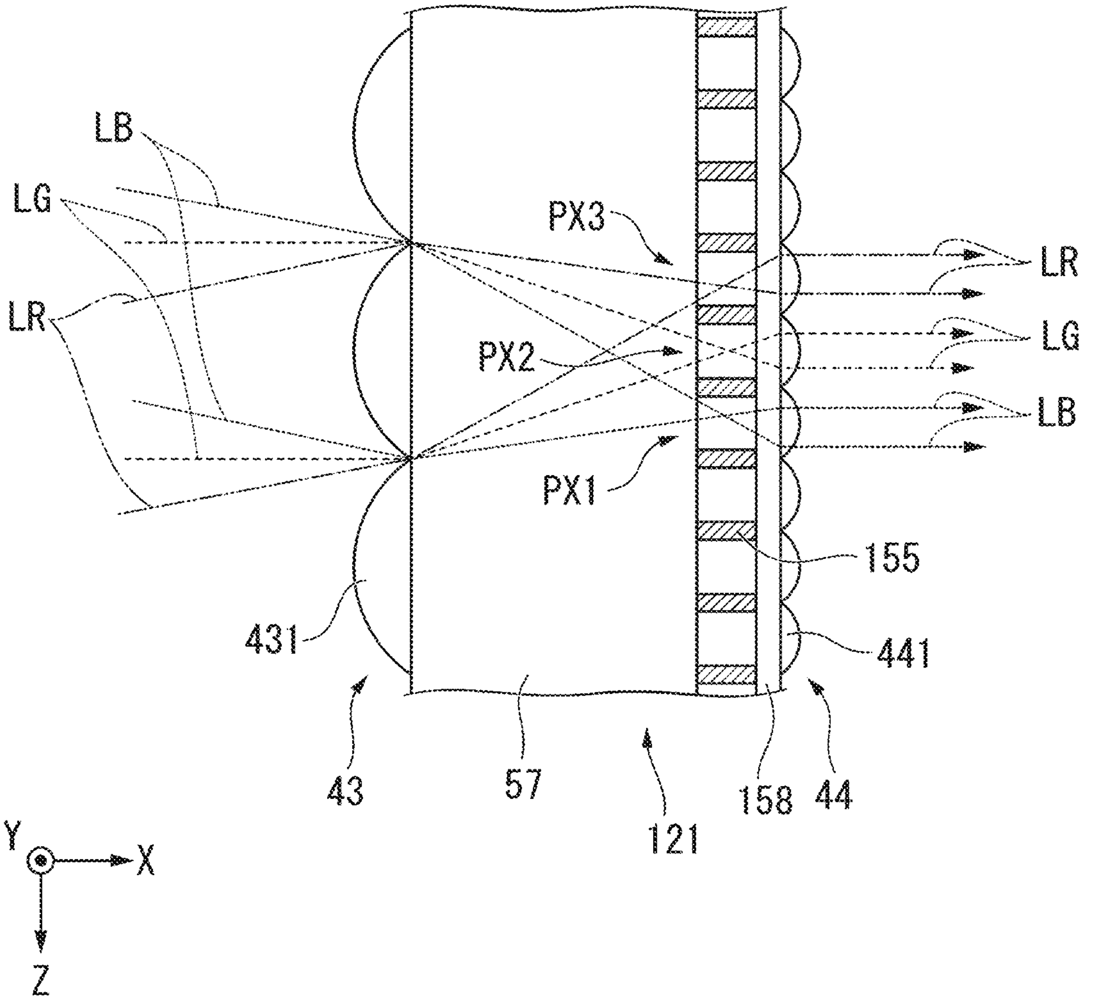
FIG. 8 is a cross-sectional view of a light modulator in the fourth embodiment.

FIG. 8 is a cross-sectional view of the light modulator 121 in the present embodiment.

The liquid crystal panel that constitutes the light modulator 121 has a light modulation region in which a plurality of blue sub-pixels PX1, a plurality of green sub-pixels PX2, and a plurality of red sub-pixels PX3 are periodically arranged in a matrix, as shown in FIG. 8. The blue sub-pixels PX1 modulate the blue light LB. The green sub-pixels PX2 modulate the green light LG. The red sub-pixels PX3 modulate the red light LR. One pixel, which is the minimum unit of an image, is formed of one blue sub-pixel PX1, one green sub-pixel PX2, and one red sub-pixel PX3. A light shielding film 155 referred to as a black matrix is provided between two adjacent sub-pixels.

The first microlens array 43 is provided on the light incident side of a first substrate 57, which constitutes the liquid crystal panel. The first microlens array 43 has a configuration in which a plurality of first microlenses 431 are arranged in a matrix. The first microlens array 43 collects the blue light, the green light, and the red light, and guides the collected blue light, green light, and red light to the sub-pixels PX1, PX2, and PX3 of the light modulator 121, respectively. Each of the first microlenses 431 is formed of a lenticular lens, and is disposed across one pixel, that is, three sub-pixels PX1, PX2, and PX3 corresponding to the different colors and arranged in one direction. In the present embodiment, a lenticular lens is presented as each of the first microlenses 431 by way of example, but not necessarily, and the first microlens array 43 may, for example, be a microlens array in which rectangular lenses are arranged in a laid brick form, a microlens array in which lenses are arranged in correspondence with sub-pixels in a delta arrangement, or a microlens array having a honeycomb structure.

The blue light LB, the green light LG, and the red light LR are incident on each of the first microlenses 431 at different angles of incidence, as described above, and thus travel in different directions and are collected. Accordingly, the blue light LB is incident on the blue sub-pixel PX1, the green light LG is incident on the green sub-pixel PX2, and the red light LR is incident on the red sub-pixel PX3. That is, the first microlens array 43 causes the blue light LB output from the second reflector to be incident on the blue sub-pixels PX1, causes the green light LG output from the transmissive optical part to be incident on the green sub-pixels PX2, and causes the red light LR output from the first reflector to be incident on the red sub-pixels PX3.

A second microlens array 44 is provided on the light exiting side of a second substrate 158, which constitutes the liquid crystal panel. The second microlens array 44 has a configuration in which a plurality of second microlenses 441 are arranged in a matrix. The second microlens array 44 parallelizes each of the three types of color light output from the liquid crystal panel. The second microlenses 441 are provided on a sub-pixel basis. The present embodiment has been described with reference to the case where the three types of color light are each parallelized after output from the liquid crystal panel, and in place of this configuration, the second microlens array 44 may be disposed on the light incident side of the liquid crystal panel to parallelize the three types of color light before incident on the liquid crystal panel.

The light-exiting-side polarizer 22 is provided on the optical axis AX2 between the light modulator 121 and the projection optical apparatus 23, as shown in FIG. 7. The light-exiting-side polarizer 22 transmits linearly polarized light output from the light modulator 121 and polarized in a specific direction toward the projection optical apparatus 23. The projection optical apparatus 23 enlarges the image light modulated by the light modulator 21 and projects the enlarged image light toward a projection receiving surface, such as a screen.

In the projector 4 according to the present embodiment, the airflow K1 generated by the first fan 17 is sent to the third duct member 37 in the sealed enclosure 60. The third duct member 37 supplies the airflow K1 sent from the first fan 17 to the light modulator 121 and the light-exiting-side polarizer 22, which form the first heat generator of the projector 4 according to the present embodiment. The airflow K1 having cooled the light modulator 121 and the light-exiting-side polarizer 22 and therefore having been heated comes into contact with the heat exchanger 45 disposed in the sealed enclosure 60.

In the projector 4 according to the present embodiment, the third fan 55 is disposed in the vicinity of the heat exchanger 45. The third housing 55*a* of the third fan 55 has suction ports 55*a*1 at opposite sides in the axial direction along the axis of rotation of the third fan 55. The third fan 55 can therefore generate the airflow K3 along the heat exchanger 45 by taking in air via the suction port 55*a*1 provided at the surface of the third housing 55*a* that faces the heat exchanger 45. The third fan 55 can therefore cool the heat exchanger 45 with the airflow K3.

The airflow K3 generated by the third fan 55 is sent to the sixth duct member 40. The sixth duct member 40 guides the airflow K3 sent from the third fan 55 along the surface of the sealed enclosure 60. The heat dissipating fins 73*b* of the third heat absorbing member 73, the heat dissipating fins 72*b* of the second heat absorbing member 72, and the heat dissipating fins 71*b* of the first heat absorbing member 71 are arranged in this order inside the sixth duct member 40.

According to the configuration described above, the airflow K3 having a low temperature can be supplied to the heat dissipating fins 73*b* corresponding to the red light LR, the temperature of which is strictly managed, and the airflow K3 having been heated to some extent can be supplied to the heat dissipating fins 71*b* corresponding to the blue light LB, the temperature of which is managed somewhat less strictly. Therefore, when the airflow K3 flowing in one direction is used, the heat dissipating fins 71*b*, 72*b*, and 73*b* of the heat absorbing members 71, 72, and 73 can be efficiently cooled.

In the projector 4 according to the present embodiment, the three types of color light LB, LG, and LR can be spatially separated by the arrangement of the light source sections 7, 8, and 9, the first transmissive optical part 13, and the reflectors 61 and 62 and the effect of the first microlens array 43 provided in the light modulator 121, and the three types of color light LB, LG, and LR are allowed to be incident on the corresponding sub-pixels PX1, PX2, and PX3. The projector 4 realized by the present embodiment is a projector capable of displaying a color image without using a color filter in the light modulator 121. Furthermore, since the two-dimensional light modulator 121 can be illuminated by scanning it in the Z-axis direction with the three types of color light LB, LG, and LR each having the major axis in the Y-axis direction, only one transmissive optical part is required, so that the configuration of the projector can be simplified and the size thereof can be reduced.

The first driver 15, which rotates the first transmissive optical part 13, can also be used as the drive source that drives the first fan 17 to cool the light modulator 121 and the light-exiting-side polarizer 22 as the first heat generator in the sealed enclosure 60. The projector 4 according to the present embodiment can therefore have an apparatus configuration further smaller than that required when a drive source that drives the first fan 17 is separately provided.

Fifth Embodiment

The configuration of the projector according to a fifth embodiment will be subsequently described. The basic configuration of the projector according to the fifth embodiment is the same as that of the projector according to the first embodiment, and the structure that couples the first driver, the first transmissive optical part, and the first fan to each other differs from that in the first embodiment. Components common to those in the first embodiment have the same reference characters and will not be described.

Figure 9:
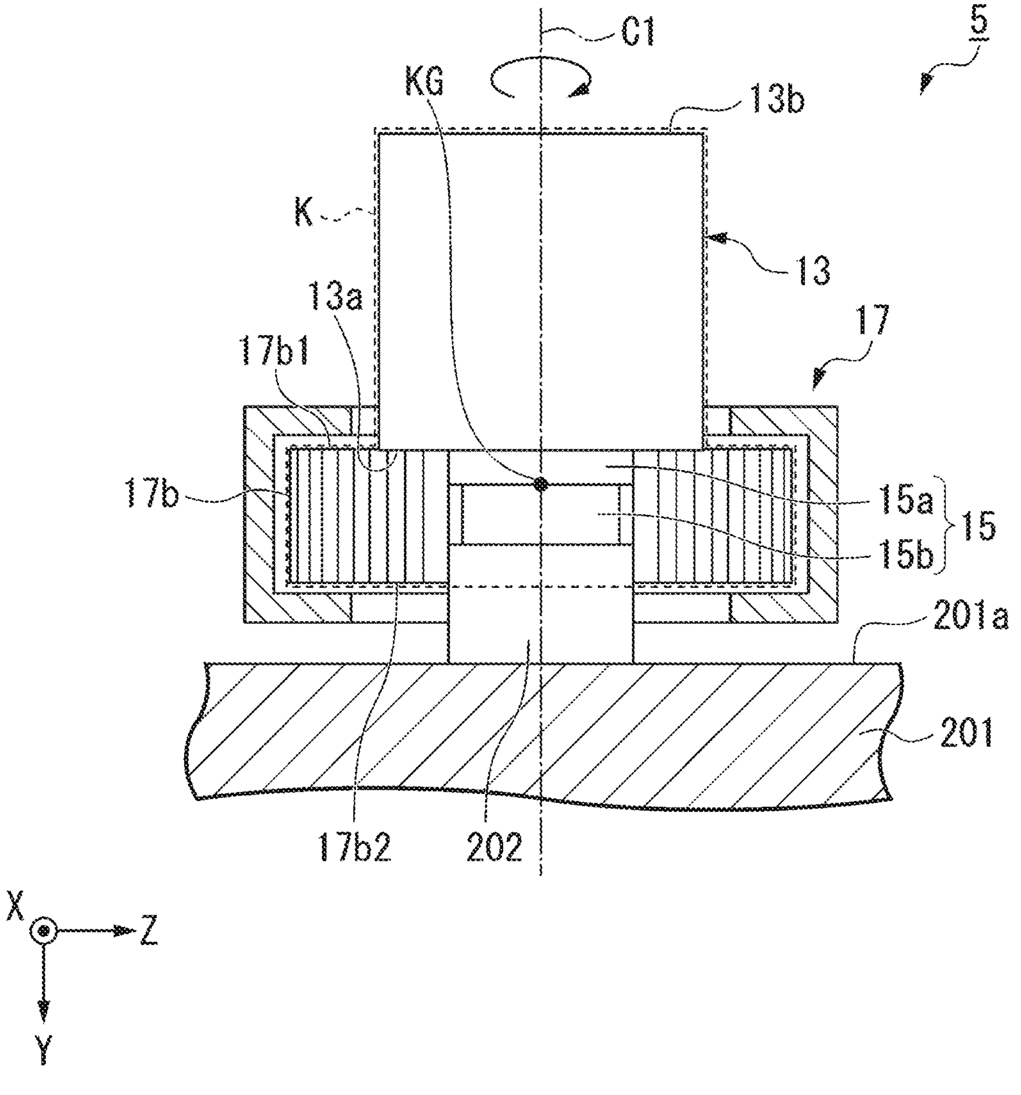
FIG. 9 shows key part configurations of the projector according to a fifth embodiment.

FIG. 9 shows the structure that couples the first driver 15, the first transmissive optical part 13, and the first fan 17 to each other.

A projector 5 according to the present embodiment further includes a support enclosure 201, which supports the optical apparatus 20, as shown in FIG. 9. The support enclosure 201 includes a protrusion 202, which protrudes from a surface 201*a* and supports the first driver 15. Note that the support enclosure 201 may constitute a part of the exterior of the projector 1.

The first driver 15 is coupled to the first surface 13*a* of the first transmissive optical part 13. The side of the first driver 15 that is opposite from the first transmissive optical part 13 is coupled to the protrusion 202 of the support enclosure 201. Specifically, the main body 15*b* of the first driver 15 is coupled to the protrusion 202.

In the present embodiment, the first blade part 17*b* of the first fan 17 is disposed so as to surround the main body 15*b* of the first driver 15, and a first end 17*b*1 of the first blade part 17*b* that is located at one side in the axial direction along the first axis of rotation C1 is coupled to the first surface 13*a* of the first transmissive optical part 13.

For example, an adhesive or screw fasteners are used to couple the first end 17*b*1 of the first blade part 17*b* to the first surface 13*a*. The axis of rotation of the first blade part 17*b* coincides with the first axis of rotation C1 of the first transmissive optical part 13.

That is, in the present embodiment, the first blade part 17*b* and the first driver 15 are coupled to the first surface 13*a* of the first transmissive optical part 13. The first driver 15 and the first blade part 17*b* are therefore not provided at any of the side surfaces of the first transmissive optical part 13. Any of the side surfaces of the first transmissive optical part 13 can therefore be used as the light incident surface or the light exiting surface.

The first driver 15 may be coupled to the first surface 13*a* of the first transmissive optical part 13 via the first blade part 17*b*, or may be directly coupled to the first surface 13*a*. The first blade part 17*b* may be coupled to the first transmissive optical part 13 via the first driver 15. To directly couple the first driver 15 to the first surface 13*a*, an opening through which the first driver 15 is inserted is formed in the first blade part 17*b*.

The first blade part 17*b* has a second end 17*b*2 located at the other side in the axial direction along the first axis of rotation C1. The second end 17*b*2 of the first blade part 17*b* is closer to the support enclosure 201 than the protrusion 202, and is separate from the surface 201*a* of the support enclosure 201.

In the present embodiment, the first housing 17*a* of the first fan 17 is fixed in a region that is not shown to the support enclosure 201 or the protrusion 202.

In the projector 5 according to the present embodiment, providing the protrusion 202 between the first driver 15 and the surface 201*a* of the support enclosure 201 allows the first surface 13*a* of the first transmissive optical part 13 and the surface 201*a* of the support enclosure 201 to be separate from each other. The axial dimension of the first blade part 17*b* of the first fan 17 coupled to the first surface 13*a* of the first transmissive optical part 13 can thus be increased.

When the position of the center of gravity of a rotor K rotated by the first driver 15 is separate from the rotary shaft 15*a* in the axial direction, there is a concern about axis wobbling. The rotor K rotated by the first driver 15 means the first transmissive optical part 13 and the first blade part 17*b*. In the projector 5 according to the present embodiment, coupling the first blade part 17*b* and the first driver 15 to the first surface 13*a* of the first transmissive optical part 13 allows an increase of the axial dimension of the first blade part 17*b*. The position of a center of gravity KG of the rotor K rotated by the first driver 15 can be brought closer to the rotary shaft 15*a*.

The projector 5 according to the present embodiment can generate the airflow K1 by rotating the first blade part 17*b* of the first fan 17 while suppressing vibration or abnormal noise caused by the axis wobbling of the rotor K rotated by the first driver 15.

The projector 5 according to the present embodiment, in which the structure that couples the second driver, the second transmissive optical part, and the second fan to each other employs the same configuration as that of the structure that couples the first driver, the first transmissive optical part, and the first fan to each other, can generate the airflow K2 by rotating the second blade part 18*b* of the second fan

18 while suppressing vibration or abnormal noise caused by the axis wobbling of the rotor rotated by the second driver 16.

In the present embodiment, the first driver 15 is disposed at the protrusion 202, which protrudes from the surface 201*a* of the support enclosure 201, to cause the first surface 13*a* of the first transmissive optical part 13 to be separate from the surface 201*a* of the support enclosure 201, so that the position of the center of gravity KG of the rotor K can be adjusted, but not necessarily in the present disclosure. For example, the axial dimension of the first blade part 17*b* may be increased by coupling a leg portion protruding from the surface 201*a* of the support enclosure 201 to the first housing 17*a* of the first fan 17, to which the first driver 15 is fixed to achieve the state in which the first surface 13*a* of the first transmissive optical part 13 is separate from the surface 201*a* of the support enclosure 201. Still instead, the leg portion may be extended from the first housing 17*a* along the surface 201*a* of the support enclosure 201, and the leg portion and the support enclosure 201 may be fixed with screws. In this case, to suppress a decrease in intake capability of the first fan, it is desirable to provide a recess recessed in the direction away from the first fan at a position on the support enclosure 201 where the recess faces the suction port 17*a*1 of the first fan 17.

The technical scope of the present disclosure is not limited to the embodiments described above, and a variety of changes can be made thereto without departing from the intent of the present disclosure. An aspect of the present disclosure can be achieved by an appropriate combination of the characteristic portions in the embodiments described above.

For example, the configuration in the first embodiment, in which the first fan 17 is provided at the second surface 13*b* of the first transmissive optical part 13, and the configuration in the fifth embodiment, in which the first fan 17 is provided at the first surface 13*a* of the first transmissive optical part 13, may be combined with each other to cause the first fan 17 to be disposed both at the first surface 13*a* and the second surface 13*b* of the first transmissive optical part 13 to improve the cooling performance of the airflow K1. Similarly, the second fan 18 may be disposed at the opposite surfaces of the second transmissive optical part 14 to improve the cooling performance of the airflow K2.

The light source apparatus in the aforementioned embodiment has been described with reference to the case where the transmissive optical parts each have a polygonal prismatic shape having an even number of side surfaces. From the viewpoint of reducing the amount of stray light and increasing the light use efficiency, the transmissive optical parts are each desirably a polygonal prism having an even number of side surfaces. Note, however, that the transmissive optical parts may each have any non-polygonal-prismatic shape having an even number of side surfaces as long as the shape has one set of a light incident surface and a light exiting surface parallel to each other. The term "rotation" in the embodiments of the present application may also include swinging the transmissive optical part to perform the same scanning.

In addition, the specific descriptions of the shape, the number, the arrangement, the materials, and other factors of the components of the light source apparatus and the projector are not limited to those in the embodiments described above and can be changed as appropriate. The aforementioned embodiments have been described with reference to the case where the light source apparatus according to the present disclosure is incorporated in a projector using a liquid crystal panel, but not necessarily. The light source apparatus according to the present disclosure may be incorporated in a projector using a digital micromirror device as the light modulator.

SUMMARY OF PRESENT DISCLOSURE

The present disclosure will be summarized below as additional remarks.

Additional Remark 1

A projector including a light source apparatus, a first heat generator that generates heat, and an optical apparatus that temporally displaces the optical path of the light output from the light source apparatus, the optical apparatus including a first transmissive optical part that transmits and outputs the light incident from the light source apparatus, a first driver that is coupled to the first transmissive optical part and rotates the first transmissive optical part, and a first blade part that is coupled to the first transmissive optical part and generates an airflow that cools the first heat generator, the first transmissive optical part rotating around a first axis of rotation along a second direction that intersects with a first direction in which the light output from the light source apparatus is incident on the first transmissive optical part to displace the optical path of the light, the first driver rotating the first blade part along with the first transmissive optical part to generate the airflow.

According to the configuration described in the additional remark 1, the airflow that cools the first heat generator can be generated by using the drive power produced by the first driver, which rotates the first transmissive optical part. The projector, in which the first driver is used as the driver that drives both the first transmissive optical part and the first blade part, can therefore have a smaller apparatus configuration than in the case where the drivers that drive the first transmissive optical part and the first blade part are separately provided. A compact projector that excels in cooling performance can therefore be provided.

Additional Remark 2

The projector described in the additional remark 1, in which the first transmissive optical part has a first surface and a second surface that intersect with the first axis of rotation, and 2×m (m is natural number greater than or equal to 2) side surfaces in contact with the first and second surfaces, and the light incident surface and the light exiting surface of the first transmissive optical part are two of the 2×m side surfaces that are parallel to each other.

According to the configuration described in the additional remark 2, since there is no light incident on the side surfaces that are not parallel to each other, the amount of stray light produced by the first transmissive optical part can be reduced, so that the light use efficiency can be increased.

Additional Remark 3

The projector described in the additional remark 2, in which the first driver is coupled to the first or second surface of the first transmissive optical part, and the first blade part is coupled to the first or second surface of the first transmissive optical part.

According to the configuration described in the additional remark 3, since the first driver and the first blade part are not coupled to any of the side surfaces of the first transmissive optical part, all the side surfaces of the first transmissive optical part can be used as the light incident surface or the light exiting surface.

Additional Remark 4

The projector described in the additional remark 3, further including a support enclosure including a protrusion that protrudes from a surface thereof and supports the optical apparatus, the first driver including a main body coupled to the protrusion and a rotary shaft that rotates with respect to the main body, the protrusion having a support surface coupled to the main body, the first driver and the first blade part being coupled to the first surface of the first transmissive optical part, the rotary shaft being coupled to the first surface of the first transmissive optical part, the first blade part being disposed so as to surround the circumference of the rotary shaft, and having a first end located at one side in the axial direction along the first axis of rotation and coupled to the first surface of the first transmissive optical part, the first blade part having a second end located at the other side in the axial direction, located closer to the surface of the support enclosure than the support surface of the protrusion, and being separate from the surface of the support enclosure.

According to the configuration described in the additional remark 4, causing the first surface of the first transmissive optical part to be separate from the surface of the support enclosure allows an increase in the axial dimension of the first blade part coupled to the first surface of the first transmissive optical part. The position of the center of gravity of the rotor rotated by the first driver can be brought closer to the rotary shaft. The airflow can therefore be generated while suppressing vibration or abnormal noise caused by the axis wobbling of the rotor rotated by the first driver.

Additional Remark 5

The projector described in any one of the additional remarks 1 to 4, in which the optical apparatus further includes a housing provided to surround the first blade part, and the housing guides the airflow generated by the first blade part.

According to the configuration described in the additional remark 5, the housing can more efficiently guide the airflow to the first heat generator. The first heat generator can therefore be efficiently cooled by the airflow.

Additional Remark 6

The projector described in the additional remark 3, further including a first base and a second base that support the optical apparatus and are disposed so as to face each other, and a bearing fixed to the second base, the first driver being coupled to one of the first and second surfaces of the first transmissive optical part, the first blade part being coupled to the other of the first and second surfaces of the first transmissive optical part, the optical apparatus further including a shaft fixed to a side of the first blade part that is opposite from the first transmissive optical part in the direction along the first axis of rotation, a side of the first driver that is opposite from the first transmissive optical part being coupled to the first base, the bearing rotatably supporting the shaft.

According to the configuration described in the additional remark 6, the opposite sides of the rotor in the axial direction in the first driver can be rotatably supported. The airflow can therefore be generated while suppressing vibration or abnormal noise caused by the axis wobbling of the rotor rotated by the first driver.

Additional Remark 7

The projector described in any one of the additional remarks 1 to 6, further including a second heat generator different from the first heat generator, which generates heat, the optical apparatus further including a second transmissive optical part that transmits and outputs the light incident from the first transmissive optical part, a second driver that is coupled to the second transmissive optical part and rotates the second transmissive optical part, and a second blade part that is coupled to the second transmissive optical part and generates an airflow that cools the second heat generator, the second transmissive optical part rotating around a second axis of rotation along a third direction that intersects with the first and second directions to displace the optical path of the light, the second driver rotating the second blade part along with the second transmissive optical part to generate the airflow.

According to the configuration described in the additional remark 7, the airflow that cools the second heat generator can be generated by using the drive power produced by the second driver, which rotates the second transmissive optical part. The projector, in which the second driver is used as the driver that drives both the second transmissive optical part and the second blade part, can therefore have a smaller apparatus configuration than in the case where the drivers that drive the second transmissive optical part and the second blade part are separately provided.

Additional Remark 8

The projector described in the additional remark 7, in which the light source apparatus includes the first heat generator, and the second heat generator includes a light modulator that modulates the light incident from the optical apparatus.

According to the configuration described in the additional remark 8, the parts that constitute the light source apparatus, which form the first heat generator, and the light modulator, which forms the second heat generator, can be cooled.

Additional Remark 9

The projector described in any one of the additional remarks 1 to 8, in which the first blade part supplies the airflow toward the first transmissive optical part.

According to the configuration described in the additional remark 9, the first transmissive optical part can be cooled by the airflow generated by the first blade part.

Additional Remark 10

The projector described in any one of the additional remarks 1 to 9, in which the first heat generator includes a light modulator that modulates the light incident from the optical apparatus, and the projector further includes a sealed enclosure that at least hermetically accommodates the first heat generator and the optical apparatus, and a heat exchanger that exchanges heat with the airflow having cooled the first heat generator.

According to the configuration described in the additional remark 10, lowering the temperature of the airflow having cooled the light modulator allows the cooled airflow to circulate as cooling air in the sealed enclosure. Accommodating the light modulator in the sealed enclosure therefore allows the light modulator to be efficiently cooled with adhesion of dust and foreign matter thereto suppressed.

Additional Remark 11

The projector described in any one of the additional remarks 1 to 10, in which the light source apparatus includes the first heat generator, the light source apparatus further includes a first light emitter that emits blue light, a second light emitter that emits green light, a third light emitter that emits red light, a first heat absorbing member that absorbs heat generated in the first light emitter, a second heat absorbing member that absorbs heat generated in the second light emitter, and a third heat absorbing member that absorbs heat generated in the third light emitter, and the first blade part supplies the airflow to the third heat absorbing member, the second heat absorbing member, and the first heat absorbing member in this order.

According to the configuration described in the additional remark 11, the heat absorbing members corresponding to the red light, the green light, and the blue light can be sequentially arranged along the airflow from upstream to downstream in descending order of strictness of the temperature management. Therefore, the airflow having a low temperature can be supplied to the heat absorbing member corresponding to the red light, the temperature of which is strictly managed, and the airflow having been heated to some extent can be supplied to the heat absorbing member corresponding to the blue light, the temperature of which is managed somewhat less strictly. Therefore, when the airflow flowing in one direction is used, the heat absorbing members can be efficiently cooled.

What is claimed is:

1. A projector comprising:

a light source apparatus;

a first heat generator that generates heat; and an optical apparatus that temporally displaces an optical path of light output from the light source apparatus, wherein the optical apparatus includes a first transmissive optical part that transmits and outputs the light incident from the light source apparatus, a first driver that is coupled to the first transmissive optical part and rotates the first transmissive optical part, and a first blade part that is coupled to the first transmissive optical part and generates an airflow that cools the first heat generator, the first transmissive optical part rotates around a first axis of rotation along a second direction that intersects with a first direction in which the light output from the light source apparatus is incident on the first transmissive optical part to displace an optical path of the light, the first driver rotates the first blade part along with the first transmissive optical part to generate the airflow, the first transmissive optical part has a first surface and a second surface that intersect with the first axis of rotation, and 2×m (m is natural number greater than or equal to 2) side surfaces in contact with the first and second surfaces, a light incident surface and a light exiting surface of the first transmissive optical part are two of the 2×m side surfaces that are parallel to each other, the first driver is coupled to the first or second surface of the first transmissive optical part, and the first blade part is coupled to the first or second surface of the first transmissive optical part.

2. The projector according to claim 1, further comprising a support enclosure including a protrusion that protrudes from a surface thereof and supports the optical apparatus, wherein the first driver includes a main body coupled to the protrusion and a rotary shaft that rotates with respect to the main body, the protrusion has a support surface coupled to the main body, the first driver and the first blade part are coupled to the first surface of the first transmissive optical part, the rotary shaft is coupled to the first surface of the first transmissive optical part, the first blade part is disposed so as to surround a circumference of the rotary shaft, and has a first end located at one side in an axial direction along the first axis of rotation and coupled to the first surface of the first transmissive optical part, and the first blade part has a second end located at another side in the axial direction, located closer to the surface of the support enclosure than the support surface of the protrusion, and is separate from the surface of the support enclosure.

3. The projector according to claim 1, wherein the optical apparatus further includes a housing provided to surround the first blade part, and the housing guides the airflow generated by the first blade part.

4. The projector according to claim 1, further comprising:

a first base and a second base that support the optical apparatus and are disposed so as to face each other; and a bearing fixed to the second base, wherein the first driver is coupled to one of the first and second surfaces of the first transmissive optical part, the first blade part is coupled to another of the first and second surfaces of the first transmissive optical part, the optical apparatus further includes a shaft fixed to a side of the first blade part that is opposite from the first transmissive optical part in a direction along the first axis of rotation, a side of the first driver that is opposite from the first transmissive optical part is coupled to the first base, and the bearing rotatably supports the shaft.

5. The projector according to claim 1, further comprising a second heat generator different from the first heat generator, which generates heat, wherein the optical apparatus further includes a second transmissive optical part that transmits and outputs the light incident from the first transmissive optical part, a second driver that is coupled to the second transmissive optical part and rotates the second transmissive optical part, and a second blade part that is coupled to the second transmissive optical part and generates an airflow that cools the second heat generator, the second transmissive optical part rotates around a second axis of rotation along a third direction that intersects with the first and second directions to displace the optical path of the light, and the second driver rotates the second blade part along with the second transmissive optical part to generate the airflow.

6. The projector according to claim 5, wherein the light source apparatus includes the first heat generator, and the second heat generator includes a light modulator that modulates the light incident from the optical apparatus.

7. The projector according to claim 1, wherein the first blade part supplies the airflow toward the first transmissive optical part.

8. The projector according to claim 1, wherein the first heat generator includes a light modulator that modulates the light incident from the optical apparatus, and the projector further comprises a sealed enclosure that at least hermetically accommodates the first heat generator and the optical apparatus; and a heat exchanger that exchanges heat with the airflow that cools the first heat generator.

9. The projector according to claim 1, wherein the light source apparatus includes the first heat generator, the light source apparatus further includes a first light emitter that emits blue light, a second light emitter that emits green light, a third light emitter that emits red light, a first heat absorbing member that absorbs heat generated in the first light emitter, a second heat absorbing member that absorbs heat generated in the second light emitter, and a third heat absorbing member that absorbs heat generated in the third light emitter, and the first blade part supplies the airflow to the third heat absorbing member, the second heat absorbing member, and the first heat absorbing member in this order.

* * * * *